United States Patent
Trock et al.

(10) Patent No.: US 10,990,739 B1
(45) Date of Patent: Apr. 27, 2021

(54) SCAN CHANNEL FABRIC FOR TILED CIRCUIT DESIGNS

(71) Applicant: Amazon Technologies, Inc., Seattle, WA (US)

(72) Inventors: Dan Trock, Katzrin (IL); Sergey Kleyman, Tel Aviv (IL); Danny Sapoznikov, Misgav Dov (IL)

(73) Assignee: Amazon Technologies, Inc., Seattle, WA (US)

(*) Notice: Subject to any disclaimer, the term of this patent is extended or adjusted under 35 U.S.C. 154(b) by 104 days.

(21) Appl. No.: 16/366,717

(22) Filed: Mar. 27, 2019

(51) Int. Cl.
*G06F 30/392* (2020.01)
*H01L 23/498* (2006.01)
*H01L 23/00* (2006.01)

(52) U.S. Cl.
CPC ...... *G06F 30/392* (2020.01); *H01L 23/49827* (2013.01); *H01L 24/66* (2013.01); *H01L 2224/4912* (2013.01)

(58) Field of Classification Search
CPC .................................................. G06F 30/392
USPC ........................................................ 716/119
See application file for complete search history.

(56) References Cited

U.S. PATENT DOCUMENTS

| 5,477,545 | A | * | 12/1995 | Huang | .......... | G01R 31/318541 |
| | | | | | | 324/762.02 |
| 7,478,302 | B2 | | 1/2009 | Veendrick | | |
| 10,523,209 | B1 | * | 12/2019 | Wang | ............ | G01R 31/318519 |
| 2014/0101500 | A1 | | 4/2014 | Bastimane et al. | | |

* cited by examiner

*Primary Examiner* — Eric D Lee
(74) *Attorney, Agent, or Firm* — Weaver Austin Villeneuve & Sampson LLP

(57) ABSTRACT

An integrated circuit device includes multiple circuit tiles disposed in a tiled arrangement in a circuit block between a first boundary and a second boundary. Each circuit tile is an instance of a circuit cell having a first edge and a second edge. The circuit cell has a scan channel circuit that includes a configurable scan channel switch and scan channels extending between the first edge and the second edge of the circuit cell through the configurable scan channel switch. Respective scan channels in the multiple circuit tiles are joined together and extend between the first boundary and the second boundary of the block of tiled arrangement. Each circuit tile can be configured to receive scan-in test data through a scan channel from either the first boundary or the second boundary, and to output scan-out result data of the circuit tile through a scan channel to either the first boundary or the second boundary.

20 Claims, 29 Drawing Sheets

SCAN CHANNEL FABRIC FOR TILED CIRCUIT DESIGNS

BACKGROUND

In design for testability (DFT) applications, integrated circuits are often designed with scan test circuitry that is used during chip manufacturing to test for various internal fault conditions. Scan test circuitry typically comprises scan chains that include multiple scan cells (registers), which are used to gain access to internal nodes of the integrated circuit. The scan cells may be implemented using a series of flip-flops or latches. The scan cells of a given scan chain are configurable to form a serial shift register for shifting in test patterns at inputs to combinational logic of the integrated circuit. The scan cells of the given scan chain are also used to capture outputs from other combinational logic of the integrated circuit. In a scan test mode of operation of the integrated circuit, the scan testing can include a scan shift phase in which the scan cells of a scan chain are configured as a serial shift register for shifting in and out of respective input and output scan data. Scan testing can also include a scan capture phase, in which the scan cells of the scan chain capture scan data from combinational logic. The captured data is subsequently shifted out to compare to expected patterns.

BRIEF DESCRIPTION OF THE DRAWINGS

Various embodiments in accordance with the present disclosure will be described with reference to the drawings, in which:

FIG. 5A is a schematic diagram illustrating a scan channel switch configuration for receiving scan-in test data from the right side of the circuit cell and returning scan-out test result data to the right side, according to certain aspects of the disclosure;

FIG. 5B is a schematic diagram illustrating a scan channel switch configuration for receiving scan-in test data from the left side of the circuit cell and returning scan-out test result data to the left side, according to certain aspects of the disclosure;

FIG. 5C is a schematic diagram illustrating a scan channel switch configuration for receiving scan-in test data from the left side of the circuit cell and returning scan-out test result data to the right side, according to certain aspects of the disclosure;

FIG. 5D is a schematic diagram illustrating a scan channel switch configuration for receiving scan-in test data from the right side of the circuit cell and returning scan-out test result data to the left side, according to certain aspects of the disclosure;

FIG. 5E is a schematic diagram illustrating a scan channel switch configuration for two feed-through scan channels, according to certain aspects of the disclosure;

FIG. 5F is a schematic diagram illustrating a scan channel switch configuration for receiving scan-in test data from the right side of the circuit cell and returning scan-out test result data to the right side, and also for passing scan-in test data from the right side to the circuit cell to the left, according to certain aspects of the disclosure;

FIG. 5G is a schematic diagram illustrating a scan channel switch configuration for receiving scan-in test data from the left side of the circuit cell and returning scan-out test result data to the left side, and also for passing scan-in test data from the left side to the circuit cell to the right, according to certain aspects of the disclosure;

FIG. 6A is a schematic diagram illustrating a tiled placement of two abutted circuit tiles, according to certain aspects of the disclosure;

FIG. 6B is a schematic diagram illustrating a scan channel configuration for a tiled placement of two abutted circuit tiles using two scan channels, according to certain aspects of the disclosure;

FIG. 6C is a schematic diagram illustrating another scan channel configuration for a tiled placement of two abutted circuit tiles using two scan channels, according to certain aspects of the disclosure;

FIG. 6D is a schematic diagram illustrating another scan channel configuration for a tiled placement of two abutted circuit tiles using two scan channels, according to certain aspects of the disclosure;

FIG. 6E is a schematic diagram illustrating another scan channel configuration for a tiled placement of two abutted circuit tiles using four scan channels, according to certain aspects of the disclosure;

FIG. 6F is a schematic diagram illustrating another scan channel configuration for a tiled placement of two abutted circuit tiles using four scan channels, according to certain aspects of the disclosure;

FIG. 6G is a schematic diagram illustrating another scan channel configuration for a tiled placement of two abutted circuit tiles using two scan channels, according to certain aspects of the disclosure;

FIG. 7A illustrates a portion of an integrated circuit device that includes three circuit tiles disposed in a tiled arrangement;

FIG. 7B is a schematic diagram illustrating a first scan channel configuration for a tiled placement of three abutted circuit tiles, according to certain aspects of the disclosure;

FIG. 7C is a schematic diagram illustrating a second scan channel configuration for a tiled placement of three abutted circuit tiles, according to certain aspects of the disclosure;

FIG. 7D is a schematic diagram illustrating a third scan channel configuration for a tiled placement of three abutted circuit tiles, according to certain aspects of the disclosure;

DETAILED DESCRIPTION

Figure 1A:
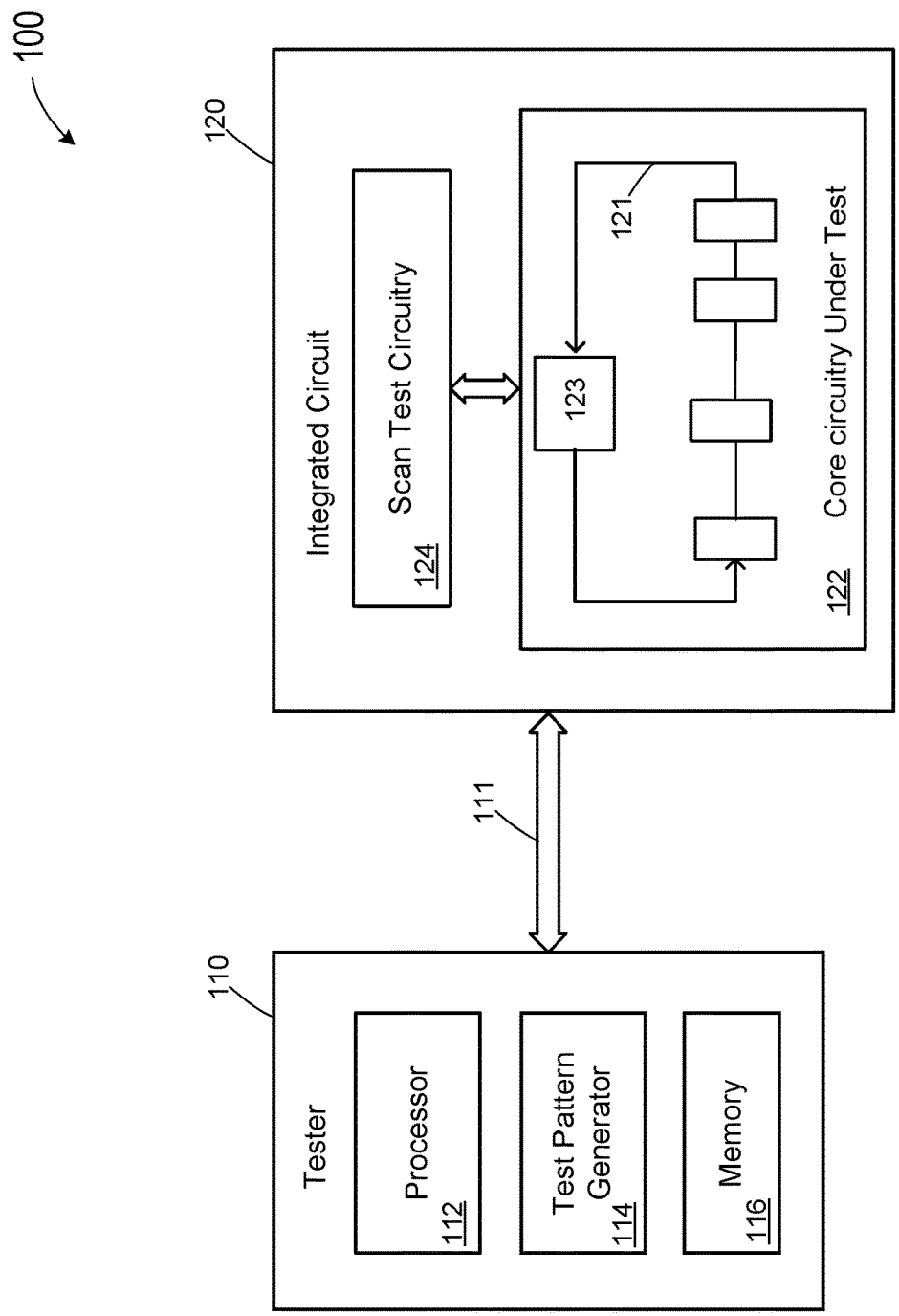
FIG. 1A is a block diagram illustrating an integrated circuit testing system, according to certain aspects of the disclosure.

In design for testability (DFT), scan test circuitry is implemented in an integrated circuit, and it requires space on the integrated circuit for routing scan channels to I/O ports for access to an external tester. A device with a high number of circuit instances, such as design core instances, may require a tiled arrangement of these instances. In this case, leaving space between the instances for wire routing incurs a high overall area penalty. In a tiled arrangement of a large number circuit cells, little or no space between the circuit cells is available for scan channel routing. One way to alleviate this problem is for the circuit cell, such as a design core, to incorporate scan channels in the circuit cell itself and provide a configurable scan channel circuitry.

According to certain aspects of the disclosure, an integrated circuit device can include multiple circuit tiles disposed in a tiled arrangement in a circuit block between a first boundary and a second boundary. Each circuit tile is an instance of a circuit cell having a first edge and a second edge. The circuit cell has a scan channel circuit that includes a configurable scan channel switch and scan channels extending between the first edge and the second edge of the circuit cell through the configurable scan channel switch. Respective scan channels in the multiple circuit tiles are joined together and extend between the first boundary and the second boundary. In other words, the scan channels in the multiple circuit tiles can be aggregated or shared. Each circuit tile can be configurable to receive scan-in test data through a scan channel from either the first boundary or the second boundary, and to output scan-out result data of the circuit tile through a scan channel to either the first boundary or the second boundary.

According to certain other aspects of the disclosure, the integrated circuit device can include multiple circuit tiles disposed in a tiled arrangement in a circuit block having a first boundary, a second boundary, a third boundary, and a fourth boundary. Each circuit tile is an instance of a circuit cell having first, second, third, and fourth edges. The scan channel circuit also includes scan channels extending between the first, second, third, and fourth edges of the circuit cell through the configurable scan channel switch. In each of the circuit tiles, the scan channel circuit is configurable to receive scan-in test data from any of the first, second, third, and fourth edges, and to output scan-out result data to any of the first, second, third, and fourth edges. In the block of a tiled arrangement, each of the circuit tiles is configurable to receive scan-in test data from any one of the first second, third, and fourth boundary, perform a test, and to output scan-out result data to any one of the first, second, third, and fourth boundary.

As an example, the configurable scan channel switch in the circuit cell can include various selection circuits, such as multiplexers, for implementing various scan channel configurations. For example, the scan channels can connect input and output nodes of the circuit cell to the internal scan test circuitry. Alternatively, the scan channels in the circuit cell can be configured as pass-through connections.

A large number of circuit tiles can be implemented in a tiled arrangement, in which each circuit tile is an instance of a circuit cell with a configurable scan channel switch. Each circuit tile can have configured scan channels. Some scan channels in a circuit tile can be configured to connect internal scan test circuitry to I/O ports to access an external tester. Other scan channels can be configured as pass-through connections in a circuit tile to facilitate scan channel configurations in neighboring circuit tiles. Such a test access scheme can be built as a scan channel network with various routing and configuration options that enable design reuse and optimization for test speed and/or routing area.

Various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the embodiments being described.

FIG. 1A is a block diagram illustrating an integrated circuit testing system, according to certain aspects of the disclosure. FIG. 1A shows an integrated circuit testing system 100 including a tester 110 and an integrated circuit 120 that is coupled to the tester 110 through an interface 111. The tester 110 can be an automated test equipment (ATE) that can include a processor 112, a test pattern generator 114, and a memory 116, etc. The processor 112 can use the test pattern generator 114 to perform various forms of scan testing and functional mode testing of the integrated circuit. The test pattern generator 114 can include software modules that are executed within the processor 120. Alternatively, the test pattern generator 114 can be implemented using dedicated logic circuits and firmware.

As further shown in FIG. 1A, the integrated circuit 120 can include a core circuitry 122 and a scan test circuitry 124, among other components and blocks. The scan test circuitry 124 is coupled to the internal core circuitry 122 for scan testing the internal core circuitry (e.g., processors, memory blocks, other combinatorial logic circuits, etc.) using the scan test circuitry. In an embodiment, the core circuitry 122 can have one or more scan chains 121 including multiple scan cells 123. The scan test circuitry 124 can implement a scan test protocol and other test modes of operation (e.g., standard scan testing, built-in-self-test (BIST) testing, and functional mode testing operations, etc.) using test patterns generated by the test pattern generator 114 of the tester 110. The scan test data generated by the scan test circuitry 124 can be accessed by the tester 110 through the interface 111.

Figure 1B:
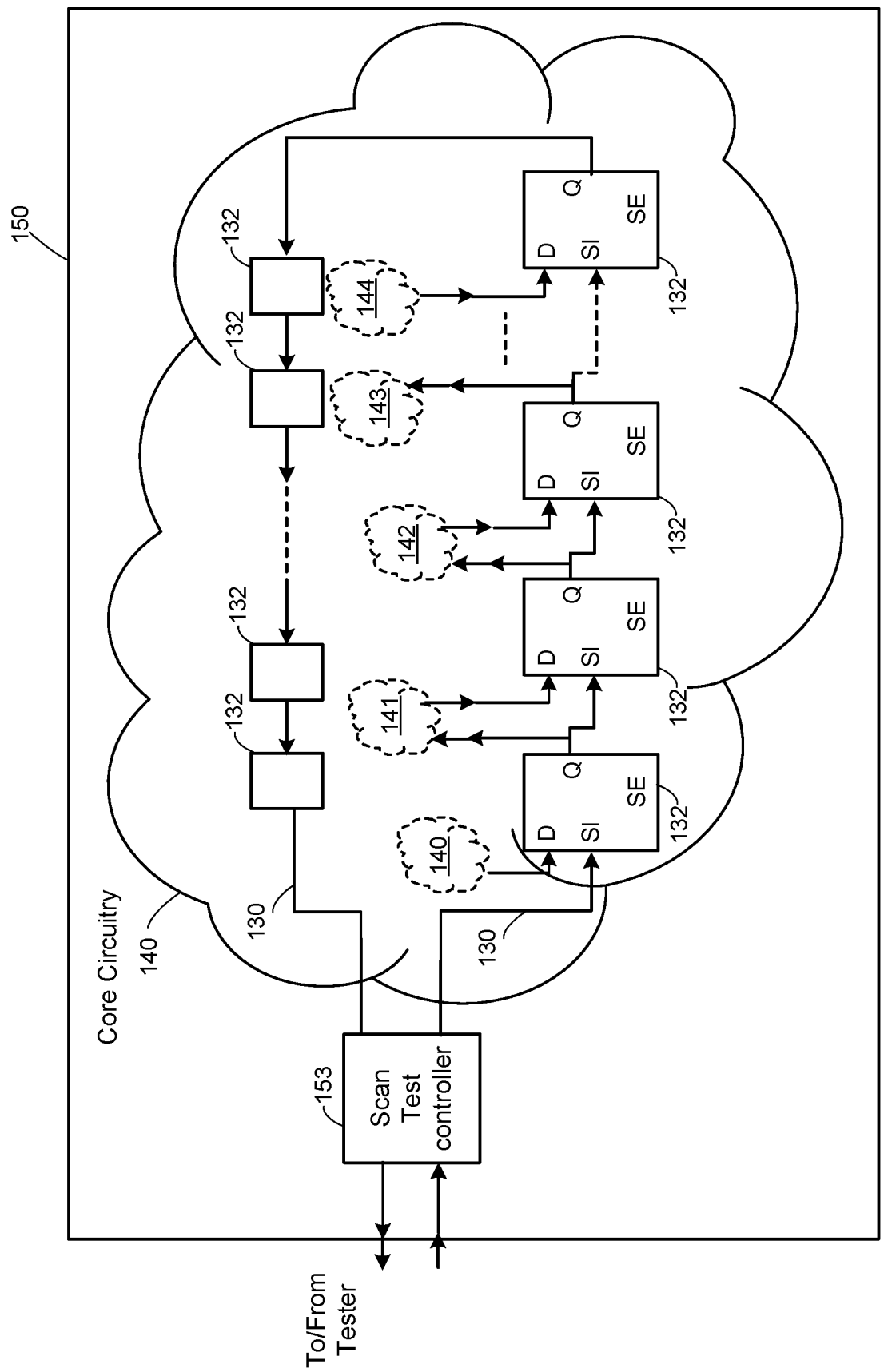
FIG. 1B is a block diagram showing a portion of an integrated circuit including a scan chain, according to certain aspects of the disclosure.

FIG. 1B is a block diagram showing a portion of an integrated circuit 150 including a scan chain, according to certain aspects of the disclosure. A scan chain 130 includes a plurality of scan cells 132 that are coupled with various circuit blocks of a core circuitry 140 that is under test. Each scan cell 132 can be a scan flip-flop (SFF) with a data (D) input port, a scan input (SI) port, a data (Q) output port, and scan enable (SE) control port. Each scan cell 132 also has a clock (CLK) input port, which is not shown to simplify the drawing. Integrated circuit 150 can have a number of scan chains, and the number of scan cells in each scan chain can vary depending on the type of integrated circuit to be tested and the target test applications.

Core circuitry 140 represents functional blocks in the core design part, and can include scan cells 132. In the example of FIG. 1B, the circuit blocks 141, 142, 143, and 144 in core circuitry 140 are arranged between the Q output port of one scan cell 132 and the D input port of an adjacent downstream scan cell 132 in the scan chain 130. Moreover, the Q output port of one scan cell 132 is connected to the SI port of an adjacent downstream scan cell 132 in the scan chain 130. The first scan input (SI) port of the first scan cell 132 in the scan chains 130 is connected to the scan test controller 153 to receive scan-in data. The Q output port of the last scan cell 132 in the scan chain 130 is connected to the scan test controller 153 to provide scan-out data. The circuit blocks 141-144, etc., can include other types of functional logic circuitry or combinatorial logic blocks, depending on the architecture and function of the integrated circuit.

The scan enable (SE) signal determines whether the device is in a functional mode or a scan mode. In the functional mode, the D input of the scan cell 132 gets data input from a functional unit. In the scan mode enabled by the SE signal, the SI input the scan cell 132 gets scan test input. The scan test result data can be shifted out of the scan chain 130 through the scan test controller to the external tester.

Figure 2A:
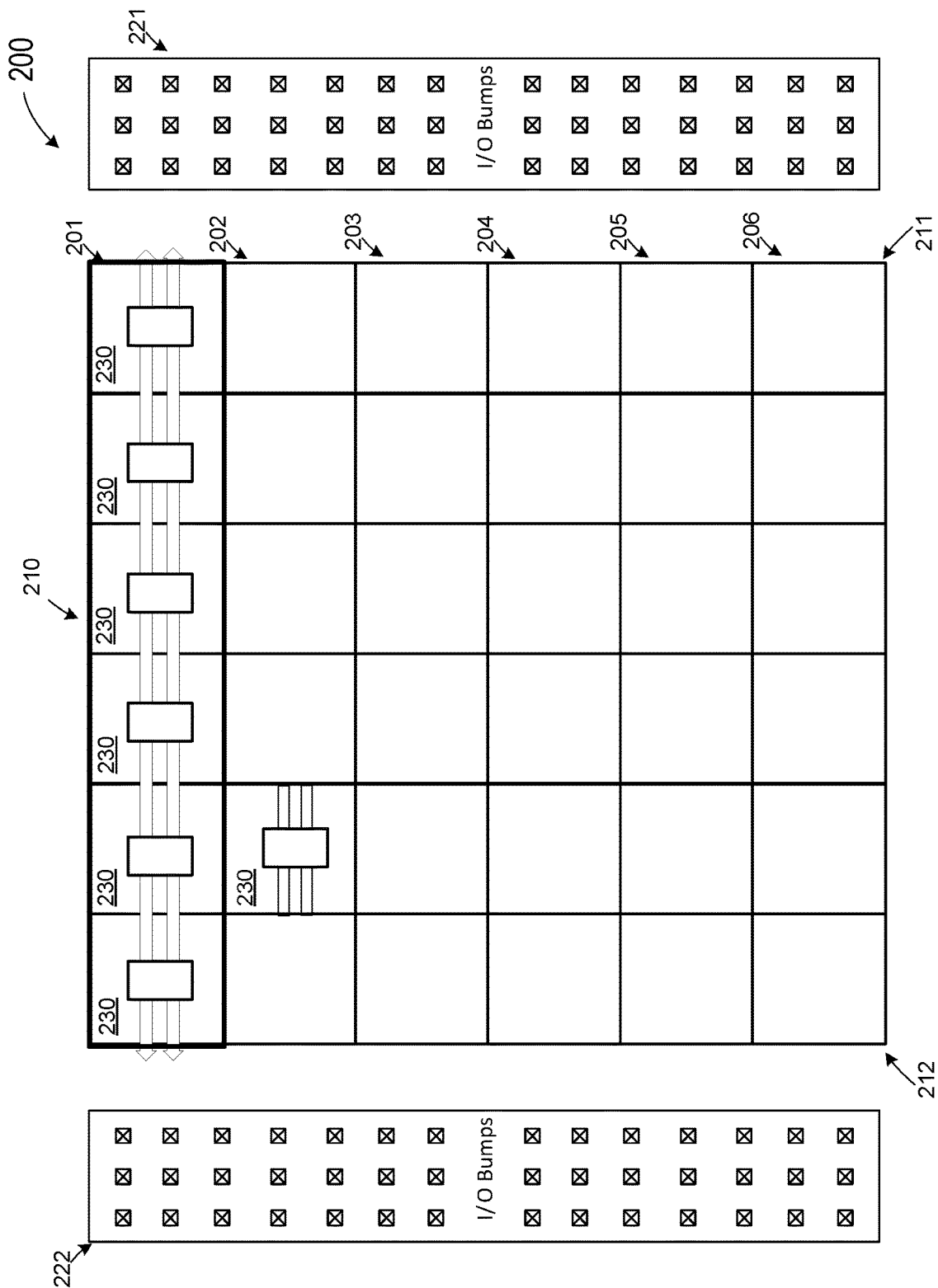
FIG. 2A is a schematic diagram illustrating a portion of an integrated circuit that includes a two-dimensional array of a tiled arrangement of circuit cells, according to certain aspects of the disclosure.

FIG. 2A is a schematic diagram illustrating a portion of an integrated circuit device that includes a two-dimensional array of a tiled arrangement of circuit cells, according to certain aspects of the disclosure. As shown in FIG. 2A, integrated circuit device 200 includes a two-dimensional array 210 of a tiled arrangement of circuit tiles. The two-dimensional array 210 includes 36 circuit tiles which are instances of an identical circuit cell 230. The 36 circuit tiles are arranged in six circuit blocks 201-206. The two-dimensional array 210 of circuit tiles has boundaries 211 and 212. Integrated circuit device 200 also includes two arrays of I/O bumps 221 and 222. I/O bumps 221 is adjacent to boundary 211, and I/O bumps 222 is adjacent to boundary 212.

In FIG. 2A, each circuit cell 230 can be a design core. For example, a design core can be a physical macro with standalone design backend implementation processes that can include logic and clock tree synthesis, scan insertion, place and route, timing closure, and more, resulting in a complete GDS-II (Graphic Database System-II) representation needed by the foundry for manufacturing the core. A device or chip may contain hundreds and even thousands of design cores. Examples of a design core can include a microprocessor, central processing unit (CPU), digital signal processor (DSP), application-specific integrated circuit (ASIC), an on-chip accelerator, or smaller function circuit blocks, etc.

Each such design core can be equipped with DFT (design for testability) logic and components, including a compress-decompress engine for scan test vectors. These engines receive a small amount of scan data channels from an automatic test equipment (ATE) external to the device, through the device's I/O pins, decompress the data and drive a high number of short internal scan chains 321. The response from this stimuli is then compacted and returned to the ATE through I/O pins to detect manufacturing defects based on comparison with a golden response simulated on a defect-free device.

A device with a high number of design core instances may require a tiled arrangement of these instances, depending on the device's layout floorplan. Here, a design core is also referred to as a circuit cell, and in a tiled arrangement, each instance of the design core is referred to as a circuit tile. In particular, when there is a large grid of identical core instances, or circuit cells, such as integrated circuit device 200 in FIG. 2, leaving space between the instances for wire routing incurs high overall area penalty (due to the replicated nature). Such a design is undesirable, because it can decrease the statistical manufacturing yield of the device and increases its total cost.

According to certain aspects of the disclosure, in such tiled arrangement of design cores when there is no spacing between them, scan channel data and other DFT control signals can be delivered to the design cores through their neighboring cores. Such a test access scheme can be built as a scan channel network with various routing and configuration options that enable better design reuse and optimization for test speed and routing area. The network of scan channels is also referred to as the scan channel fabric or a DFT fabric, with each circuit tile representing a node in the scan channel fabric.

Locations of I/O connections in the device floorplan can vary. Therefore, according to certain aspects of the disclosure, a scan channel can traverse through the network in all four directions and change direction at any specific node in the network according to a pre-defined configuration.

The network bus width can be reduced to roughly as low as the number of channels needed for testing a single sub-tile core. In such a configuration, area penalty can be reduced since fewer wires are routed through the grid and smaller physical channels may be allocated for the network. In such a configuration, one circuit tile is tested one at a time, and testing of the complete grid requires a serial scheduling of all circuit tiles. Alternatively, when there is an abundance of I/O pins in device, all circuit tiles may be tested in parallel at the expense of routing wider network busses through the grid.

The node in the scan channel network can be statically configured before the test begins, and the configuration defines how the incoming and outgoing data is routed and whether the circuit tile itself takes over a full or a partial range of the bus to send out its own data in that specific network configuration. For parallel testing with broadcast input data, the number of compensation pipelines is also configured for each node. Alternatively, the configuration can also be performed by a processor in the integrated circuit. The configuration inputs can be a function of device absolute or relative position. Further, the configuration can be constant or configurable at test time.

In the example of FIG. 2A, there are two side-attached arrays 221 and 222 with evenly distributed I/O bumps. In this example, based on the location of I/O in floorplan, DFT signals and data flow only in east-west direction, while the north-south interconnect of the network is not activated.

Figure 2B:
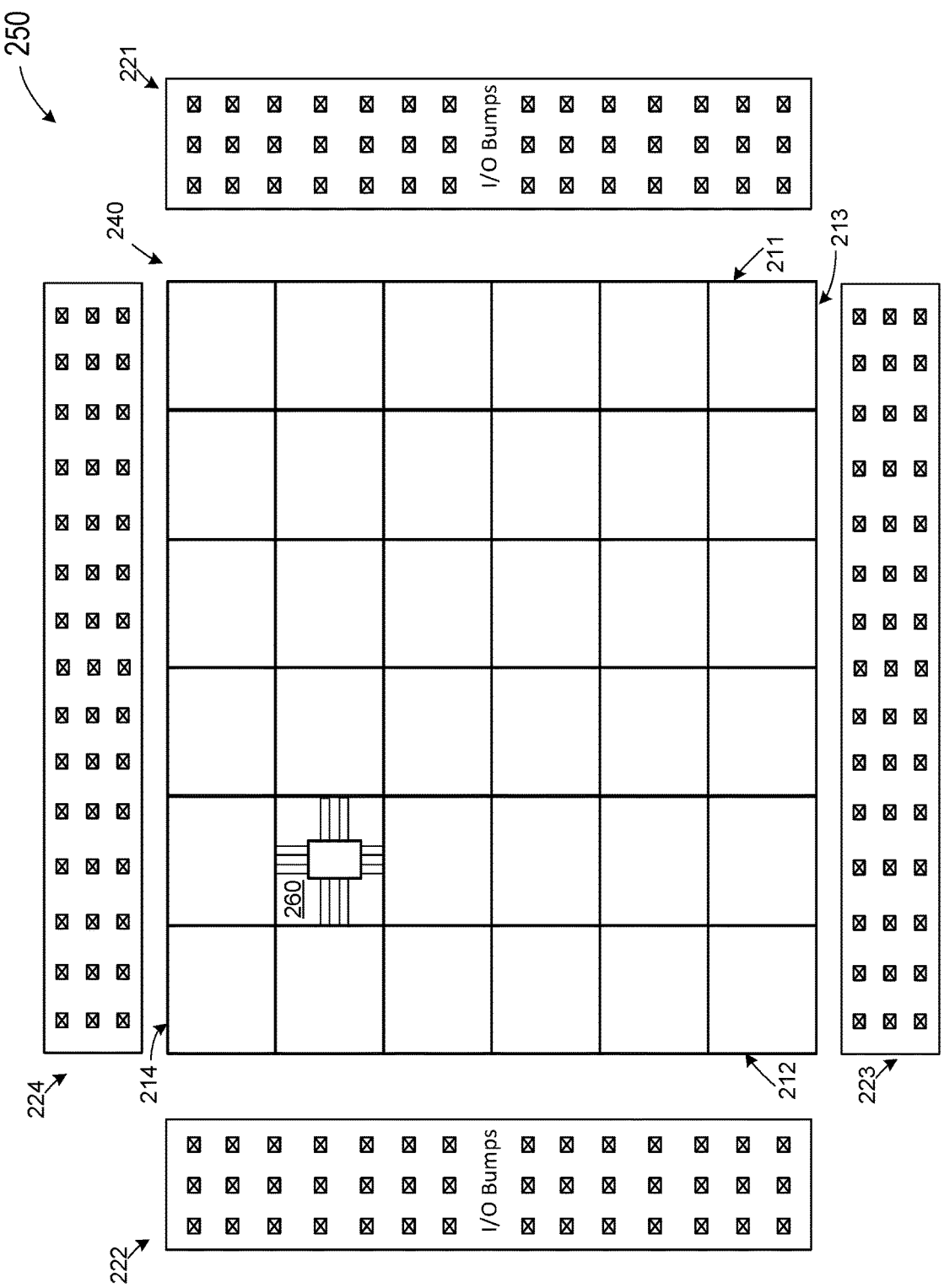
FIG. 2B is a schematic diagram illustrating a portion of another integrated circuit that includes a two-dimensional array of a tiled arrangement of circuit cells, according to certain aspects of the disclosure.

FIG. 2B is a schematic diagram illustrating a portion of an integrated circuit that includes a two-dimensional array of a tiled arrangement of circuit cells, according to certain aspects of the disclosure. As shown in FIG. 2A, integrated circuit device 200 includes a two-dimensional array 240 of a tiled arrangement of circuit tiles. The two-dimensional array 240 includes 36 circuit tiles which are instances of an identical circuit cell 260. The two-dimensional array 240 of circuit tiles has four boundaries: a first boundary 211, a second boundary 212, a third boundary 213, and a fourth boundary 214. Integrated circuit device 250 also includes four arrays of I/O bumps 221, 222, 223, and 224. I/O bumps 221 are adjacent to boundary 211, I/O bumps 222 are adjacent to boundary 212, I/O bumps 223 are adjacent to boundary 213, and I/O bumps 224 are adjacent to boundary 214. In the example of FIG. 2B, there are four side-attached arrays of I/O bumps. Circuit cell 260 includes scan channels that can be routed between any of the four edges of the circuit cell. In this example, based on the location of I/O in floorplan, DFT signals and data flow can start with any of the four boundaries and reach any of the four boundaries, according to some aspects of the disclosure.

Figure 3:
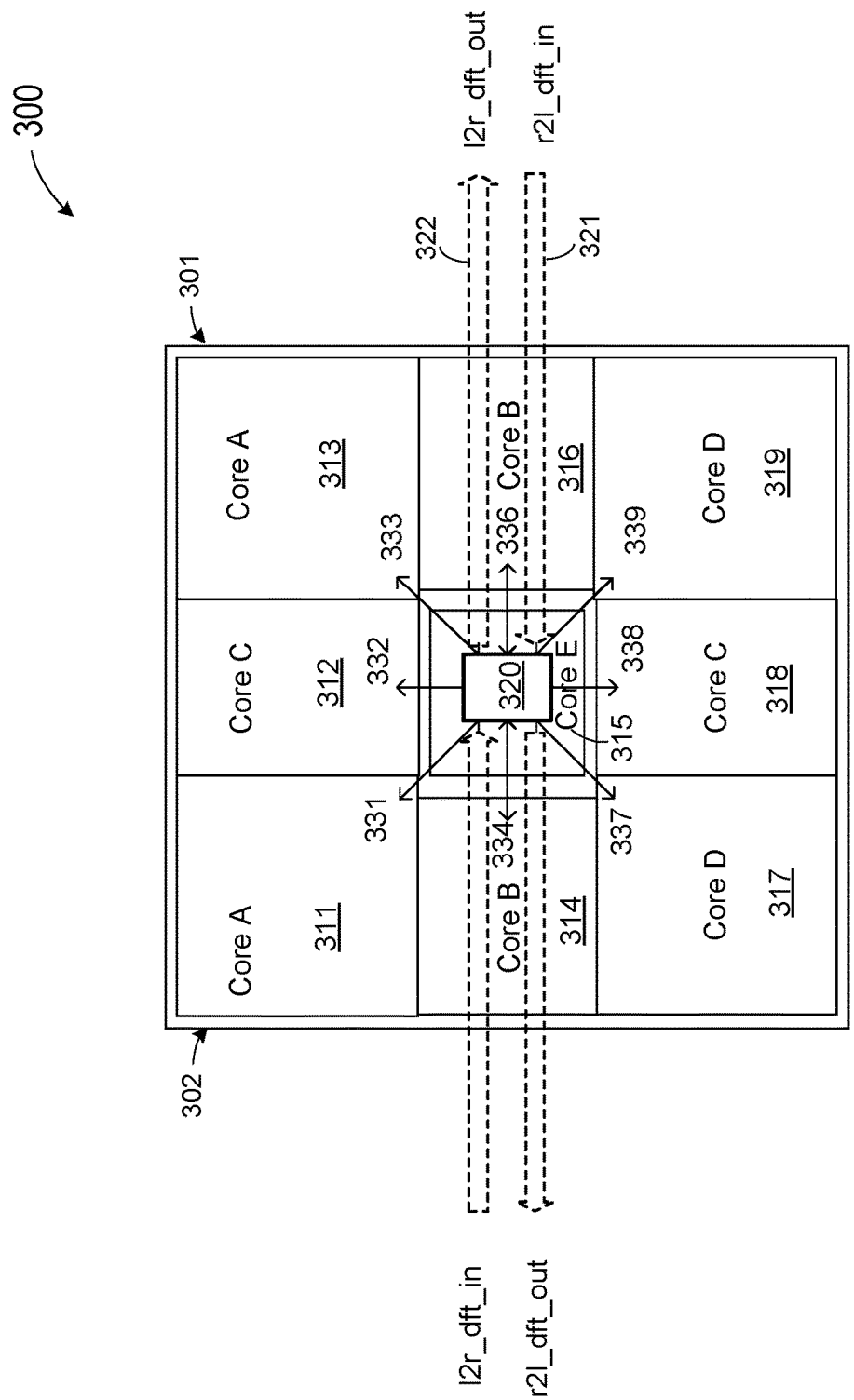
FIG. 3 is a schematic diagram illustrating an exemplary circuit cell including a scan channel configuration, according to certain aspects of the disclosure.

FIG. 3 is a schematic diagram illustrating an exemplary circuit cell including scan channels, according to certain aspects of the disclosure. In FIG. 3, circuit cell 300 is an example of the circuit cell that can be used as circuit tiles 230 in the tiled arrangement in FIG. 2. Circuit cell 300 represents a design core described above. As shown in FIG. 3, circuit cell 300 has a first edge 301 and a second edge 302. The circuit cell 300 has a scan channel circuit that can include a configurable scan channel switch 320 and scan channels 321 and 322 that extend between the first edge 301 and the second edge 302 of the circuit cell 300. In FIG. 3, the scan channel 321 extends in a direction from right to left. Therefore, an input of scan channel 321 is labeled r2l_dft_in, and an output of scan channel 321 is labeled r2l_dft_out, with r2l designating right-to-left. Similarly, the scan channel 322 extends in a direction from left to right. Therefore, an input of scan channel 322 is labeled l2r_dft_in, and an output of scan channel 322 is labeled l2r_dft_out, with l2r designating left-to-right. The scan channels 321 and 322 pass through the configurable scan channel switch 320.

The configurable scan channel switch 320 includes a scan test interface circuit (not shown) and selectively couples the scan channels to a scan test circuit in the circuit cell 300 for receiving scan-in test data for performing scan tests in the circuit cell, and for outputting scan-out test result data from the scan test circuit. The scan test circuit is not shown in FIG. 3 to simplify the drawings, but it can be similar to the scan test circuits described above in connection with FIGS. 1A and 1B. The circuit cell can include other circuit blocks, which can also be different design cores. For example, the circuit cell 300 in FIG. 3 includes circuit blocks 311-319. Circuit blocks 311-319 can include various design cores. For example, circuit blocks 311 and 313 are labeled Core A, circuit blocks 314 and 316 are labeled Core B, circuit block 312 and 318 are labeled Core C, circuit blocks 317 and 319 are labeled Core D, and circuit block 315 is labeled Core E. In this example, the configurable scan channel switch 320 is shown as being embedded in circuit block 315 is labeled Core E. However, other arrangements can also be used. The circuit cell 300 also includes internal scan channels 331-334 and 337-339 coupled to circuit blocks 311-314 and 316-319. In FIG. 3, the communication buses between the circuit blocks are not shown to simplify the drawing.

Figure 4:
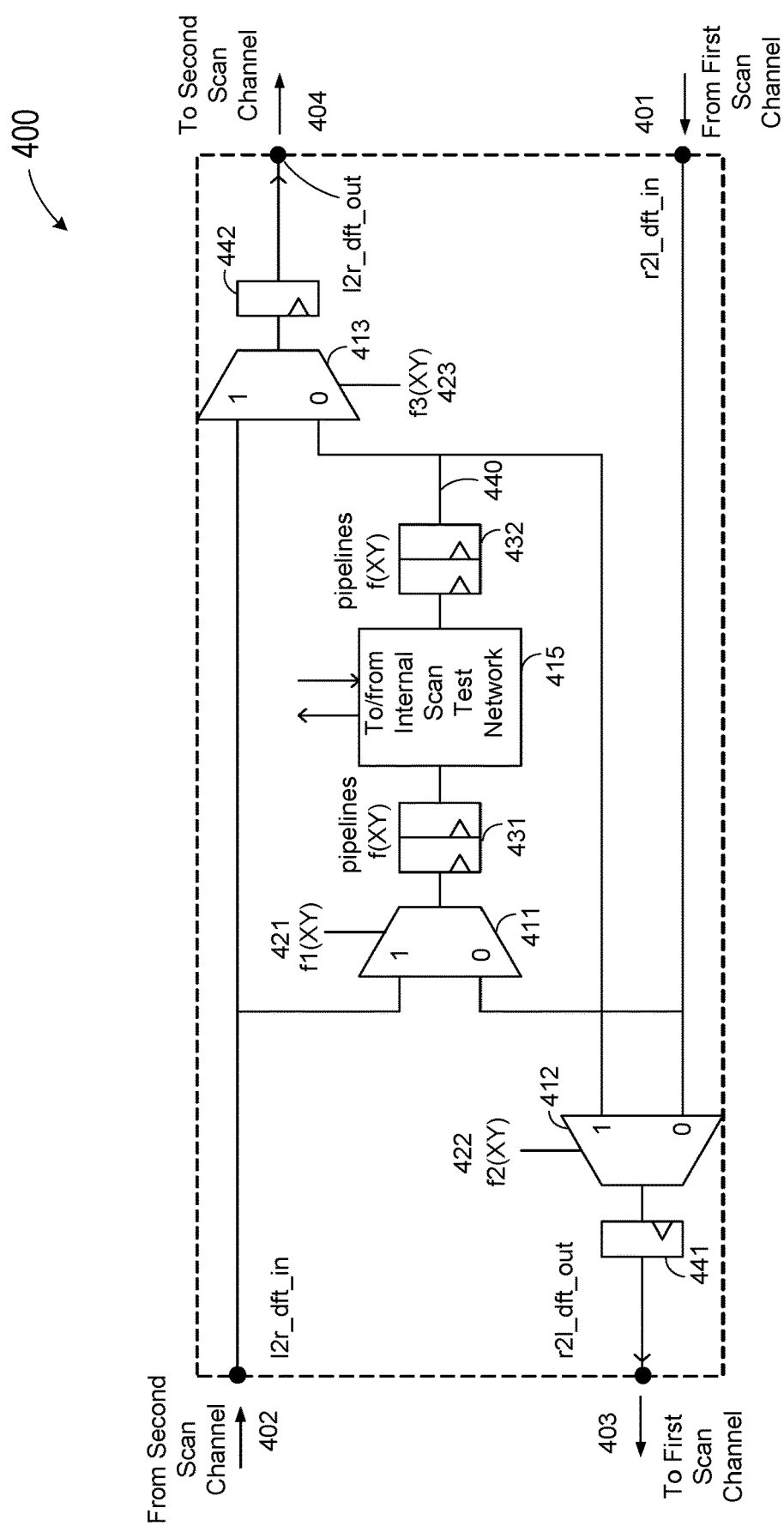
FIG. 4 is a schematic diagram illustrating a scan channel switch in a circuit cell, according to certain aspects of the disclosure.

FIG. 4 is a schematic diagram illustrating a configurable scan channel switch in a circuit cell, according to certain aspects of the disclosure. In FIG. 4, configurable scan channel switch 400 is an example of a scan channel switch that can be used in the scan channel circuit 320 in circuit cell 300. In this example, configurable scan channel switch 400 is illustrated for configuring two scan channels in the circuit cell. Configurable scan channel switch 400 can be expanded for configuring a higher number of scan channels.

As shown in FIG. 4, configurable scan channel switch 400 includes a first input node 401 configured to receive scan-in data from a first scan channel, a second input node 402 configured to receive scan-in data from a second scan channel, a first output node 403 for providing scan-out data from the scan test circuit to the first scan channel, and a second output node 404 configured for providing scan-out data from the scan test circuit to the second scan channel. In this example, scan channel switch 400 is used in a left-right arrangement. Therefore, the first input node 401 is also labeled r2l_dft_in, the second input node 402 is also labeled l2r_dft_in, the first output node 403 is also labeled r2l_dft_out, and the second output node 404 is also labeled r2l_dft_out. In these labels, "r2l" designates right-to-left, "l2r" designates left-to-right, and "dft" designates design for testing. As noted in FIG. 4, in the scan channel switch 400, the first input node 401 receives data from the first scan channel as shown in FIG. 3, and the first output node 403 outputs data to the first scan channel as shown in FIG. 3. Similarly, the second input node 402 receives data from the second scan channel as shown in FIG. 3, and the second output node 404 outputs data to the second scan channel as shown in FIG. 3.

It is understood, however, that scan channel switch 400 can also be used in an up-down arrangement. Alternatively, a scan channel switch can also be used for connecting input/output nodes at adjacent edges.

As shown in FIG. 4, scan channel switch 400 also includes multiple selection circuits 411-413 for implementing various scan channel connections in response to selection signals 421-423, respectively. In this example, selection circuits 411-413 are multiplexers that can selectively couple one of two inputs to the output. The selection signals 421-423 are examples of configuration input data to the selection circuits.

A first selection circuit 411, in response to a first selection signal 421, f1(XY), is configured to couple either scan-in data from the first input node 401 or scan-in data from the second input node 402 to a scan test interface circuit 415 for coupling to an internal scan test circuit (not shown). Similarly, a second selection circuit 412, in response to a second selection signal 422, f2(XY), is configured to couple either an output 440 from the scan test interface circuit 415 or the first input node 401 to the first output node 403. Moreover, a third selection circuit 413, in response to a third selection signal f3(XY), is configured to either couple the scan-out data 440 from the scan test interface circuit 415 or the second input node 402 to the second output node 404. Scan channel switch 400 can also include output latches 441 and 442, which are connected to output nodes 403 and 404, respectively.

In FIG. 4, the selection signals 421, 422, and 423 are designated as f1(XY), f2(XY), and f3(XY), respectively, to indicate that the selection signals f1, f2, and f3 are functions of the location (XY) of the circuit tile that contains this scan channel switch in the integrated circuit. Selection signals in different circuit tiles can have different values to allow scan channels in different circuit tiles to be configured differently. Further, in this example, each of the selection circuits 411-413 is shown as a multiplexer for receiving two inputs and selecting one of the inputs for transmitting to an output. In other examples, the selection circuit can be implemented using other logic circuits. Further, in still other examples, more than two scan channels can be included in the scan channel circuit in the circuit cell. In that case, the selection circuit in the scan channel switch can be implemented using a higher number of 2-input multiplexers, or a multiplexer having more than two inputs. Alternatively, the scan channel switch for more than two channels can include selection circuits that are implemented using different logic circuits. In some cases, multiple copies of scan channel switch 400 as illustrated in FIG. 4 can be used with respective scan channels.

In some examples, scan channel switch 400 can also include pipelines of sampling stages, such as 431 and 432, as shown in FIG. 4. One of the factors that can impact the total cost of a device is its test time. Test time is often directly related to the speed at which the scan data is delivered to the design cores from ATE and the test result returned back to the ATE. To improve the speed, sampling pipeline stages, such as 421 and 422, are installed along the data path. The circuit cells, or design cores, that are more distant from the I/O terminals can have more sampling stages to sustain the same speed since that data travels a longer path. To improve test time further within a limited I/O budget, multiple identical cores can share input scan data channels and run identical scan test simultaneously. However, the amount of sampling stages needs to be identical for the cores to enable such sharing. For this purpose, the design cores that are closer to the I/O can be configured to have more internal sampling stages for compensation and in order to equal the number of stages to that of the design cores that are more distant from the I/O. For this purpose, compensation pipelines 431 and 432 are also labeled f(XY) to indicate that different compensation pipelines can be used for different circuit files at location (XY) of the integrated circuit. Configurable scan channel switch 400 can be used for flexible scan channel configurations, as explained below.

FIGS. 5A-5G are schematic diagrams illustrating various configurations of the scan channel switch, according to certain aspects of the disclosure. As described above in connection with FIG. 4, a scan channel switch can include a number of selection circuits for connecting multiple scan channels. Some examples are illustrated below, with reference to FIGS. 5A-5G, and the description of FIG. 4.

Figure 5A:
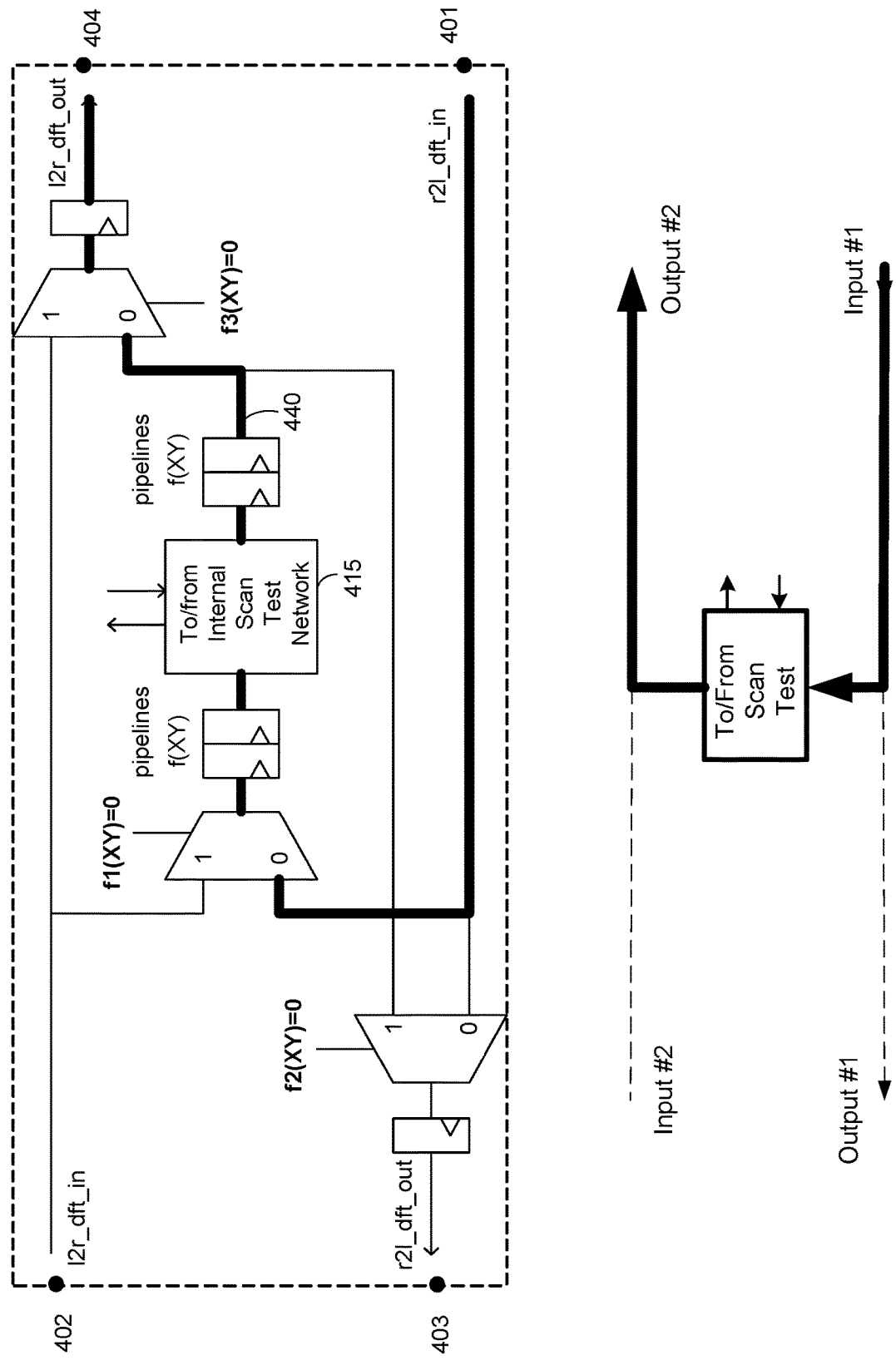
FIGS. 5A-5G are schematic diagrams illustrating various scan channel configurations, according to certain aspects of the disclosure.

FIG. 5A is a schematic diagram illustrating a scan channel switch configuration for receiving scan-in test data from the right side of the circuit cell and returning scan-out test result data to the same side, according to certain aspects of the disclosure. A simplified schematic diagram of scan channel switch 400 of FIG. 4 is reproduced in an upper part of FIG. 5A, in which the activated connections are shown in thick lines. It can be seen that the first selection signal f1(XY) is a "0," and, therefore, scan-in test data from the first input node 401 is connected to scan test interface circuit 415 for coupling to an internal scan test circuit (not shown). Further, the third selection signal f3(XY) is a "0," indicating that the output 440 from the scan test interface circuit 415 is connected to the second output node 404. Moreover, the second selection signal f2(XY) is a "0" indicating that scan-in test data from the first input node 401 is connected to the first output node 403. A simplified schematic is shown in the lower part of FIG. 5A illustrating the configuration described above. It can be seen that scan-in test data from the first input input #1 is delivered to the internal scan test circuit, and the scan-out test result data is transmitted to the second output Output #2.

Figure 5B:
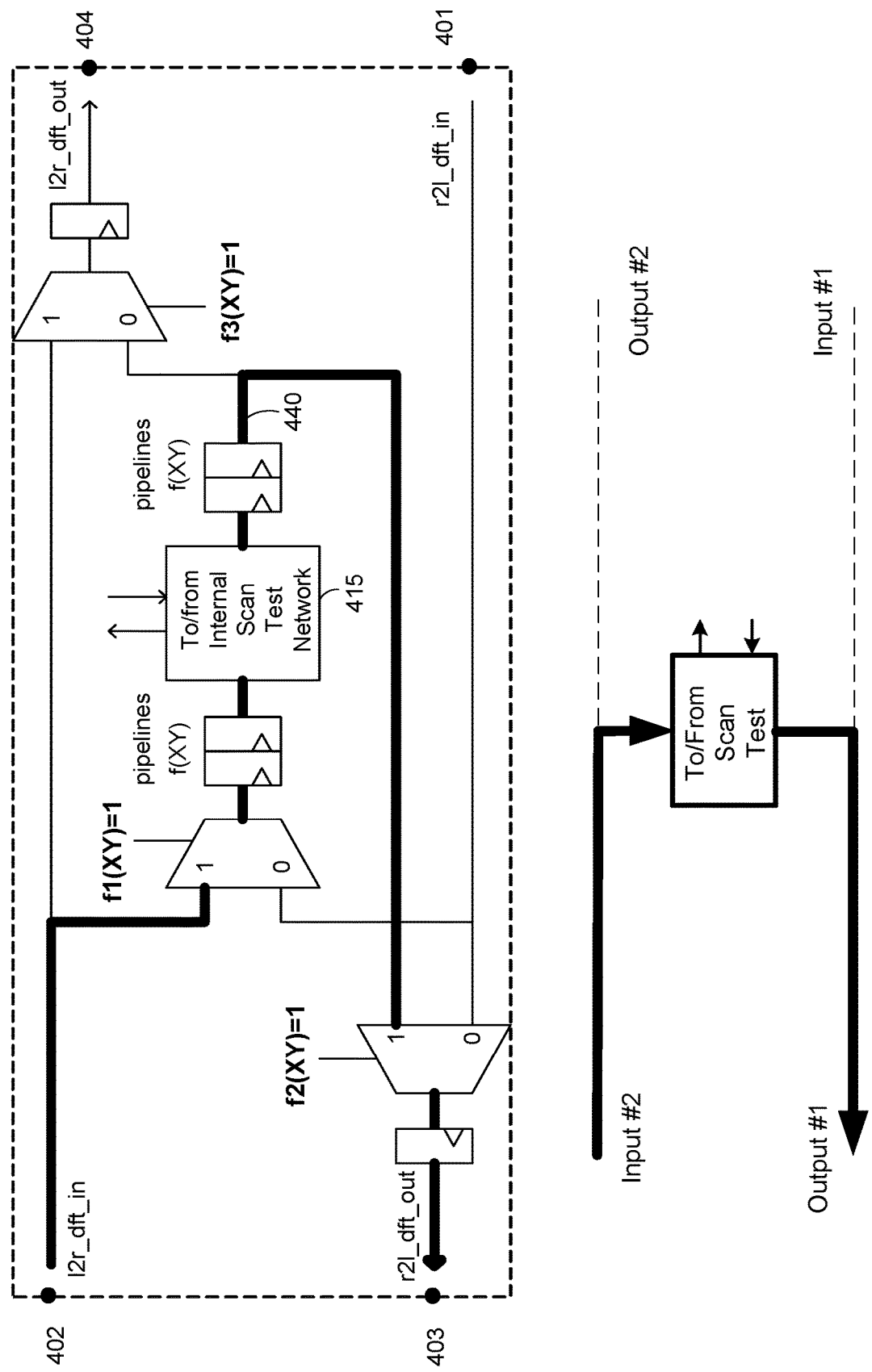

FIG. 5B is a schematic diagram illustrating a scan channel switch configuration for receiving scan-in test data from the left side of the circuit cell and returning scan-out test result data to the same side, according to certain aspects of the disclosure. A simplified schematic diagram of scan channel switch 400 of FIG. 4 is reproduced in an upper part of FIG. 5B, in which the activated connections are shown in thick lines. It can be seen that the first selection signal f1(XY) is a "1," and, therefore, scan-in test data from the second input node 402 is connected to scan test interface circuit 415 for coupling to an internal scan test circuit. Further, the second selection signal f2(XY) is a "1," and the output 440 from the scan test interface circuit 415 is connected to the first output node 403. Moreover, the third selection signal f3(XY) is a "1" indicating that scan-in test data from the second input node 402 is to the second output node 404. A simplified schematic is shown in the lower part of FIG. 5B illustrating the configuration described above. It can be seen that scan-in test data from the second input input #2 from the left of the circuit cell is delivered to the internal scan test circuit, and the scan-out test result data is transmitted to the first output Output #1.

Figure 5C:
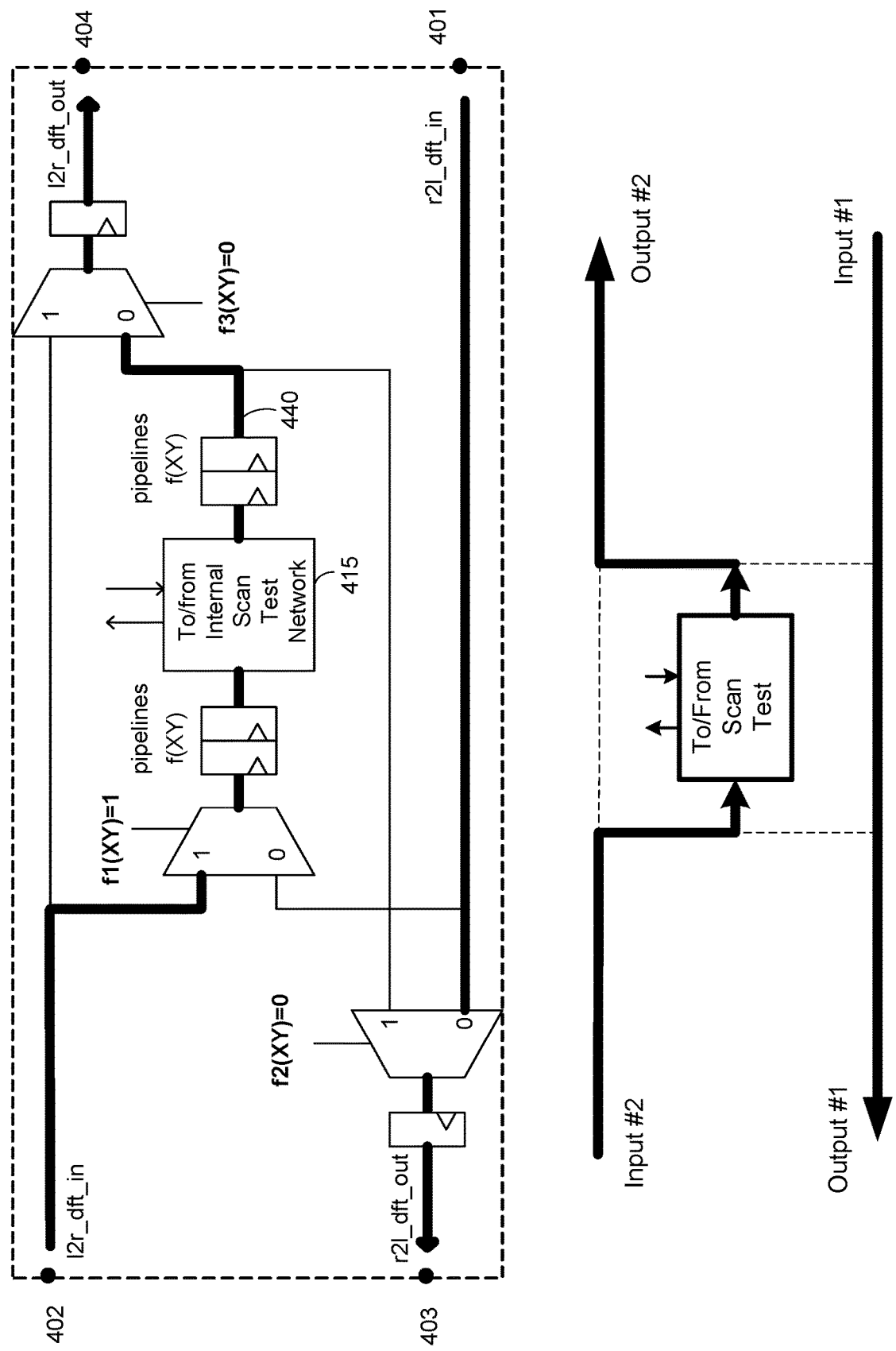

FIG. 5C is a schematic diagram illustrating a scan channel switch configuration for receiving scan-in test data from the left side of the circuit cell and returning scan-out test result data to the right side, according to certain aspects of the disclosure. A simplified schematic diagram of scan channel switch 400 of FIG. 4 is reproduced in an upper part of FIG. 5C, in which the activated connections are shown in thick lines. It can be seen that the first selection signal f1(XY) is a "1," and, therefore, scan-in test data from the second input node 402 is connected to scan test interface circuit 415 for coupling to an internal scan test circuit. Further, the third selection signal f3(XY) is a "0," and the output 440 from the scan test interface circuit 415 is connected to the second output node 404. Moreover, the second selection signal f2(XY) is a "0," indicating that scan-in test data from the first input node 401 is connected to the first output node 403. A simplified schematic is shown in the lower part of FIG. 5B illustrating the configuration described above. It can be seen that scan-in test data from the second input input #2 from the left of the circuit cell is delivered to the internal scan test circuit, and the scan-out test result data is transmitted to the first output Output #1. Further, a scan channel feed-through connection is formed between Input #1 and Output #1, allowing the scan channel to be used in another circuit cell.

Figure 5D:
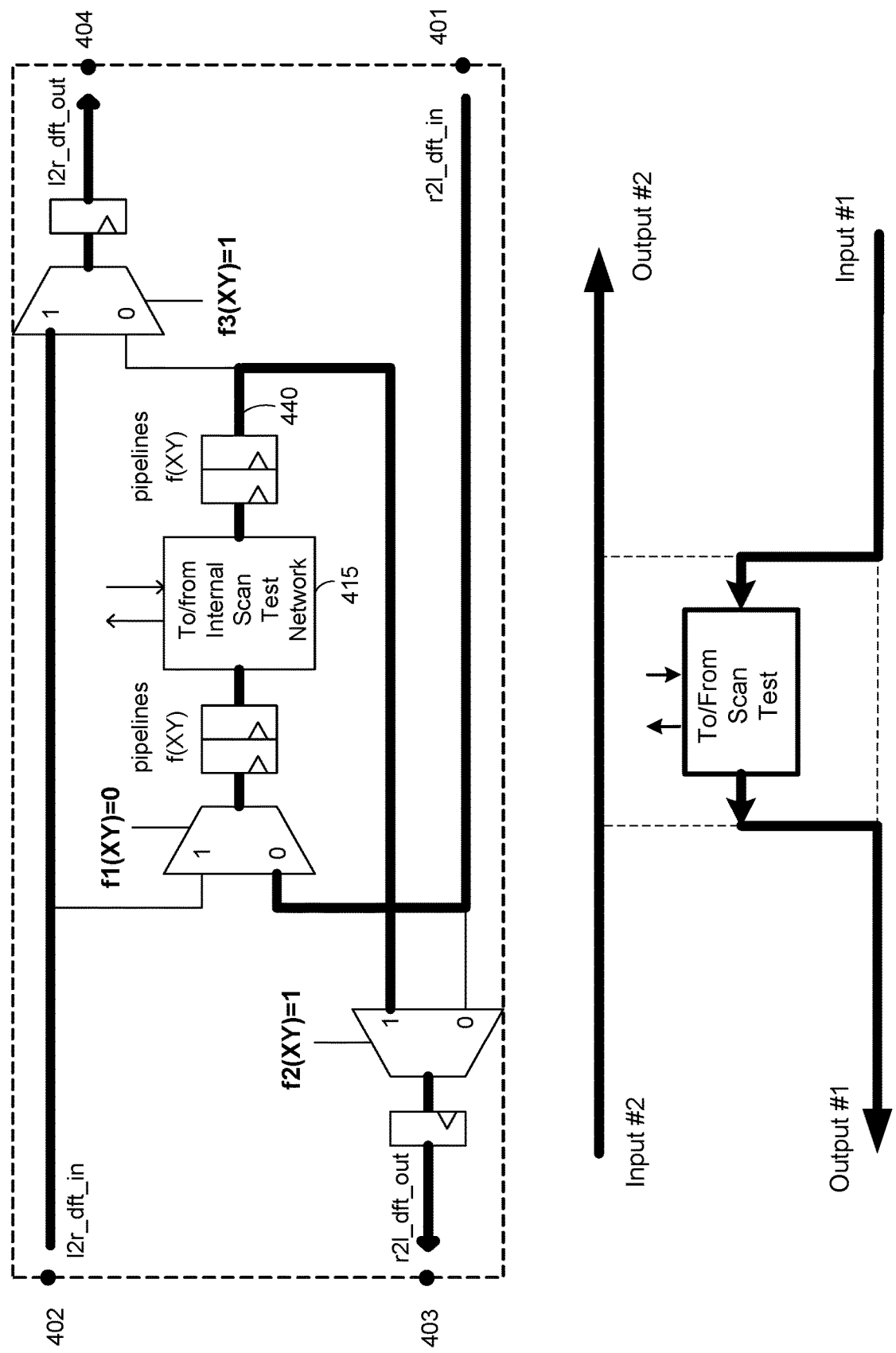

FIG. 5D is a schematic diagram illustrating a scan channel switch configuration for receiving scan-in test data from the right side of the circuit cell and returning scan-out test result data to the left side, according to certain aspects of the disclosure. A simplified schematic diagram of scan channel switch 400 of FIG. 4 is reproduced in an upper part of FIG. 5D, in which the activated connections are shown in thick lines. It can be seen that the first selection signal f1(XY) is a "0," and, therefore, scan-in test data from the first input node 401 is connected to scan test interface circuit 415 for coupling to an internal scan test circuit. Further, the second selection signal f2(XY) is a "1," and the output 440 from the scan test interface circuit 415 is connected to the first output node 403. Moreover, the third selection signal f3(XY) is a "1," indicating that scan-in test data from the second input node 402 is connected to the second output node 404. A simplified schematic is shown in the lower part of FIG. 5B illustrating the configuration described above. It can be seen that scan-in test data from the first input input #1 from the right of the circuit cell is delivered to the internal scan test circuit, and the scan-out test result data is transmitted to the first output Output #1 on the left side. Further, a scan channel feed-through connection is formed between Input #2 and Output #2, allowing the scan channel to be used in another circuit cell.

Figure 5E:
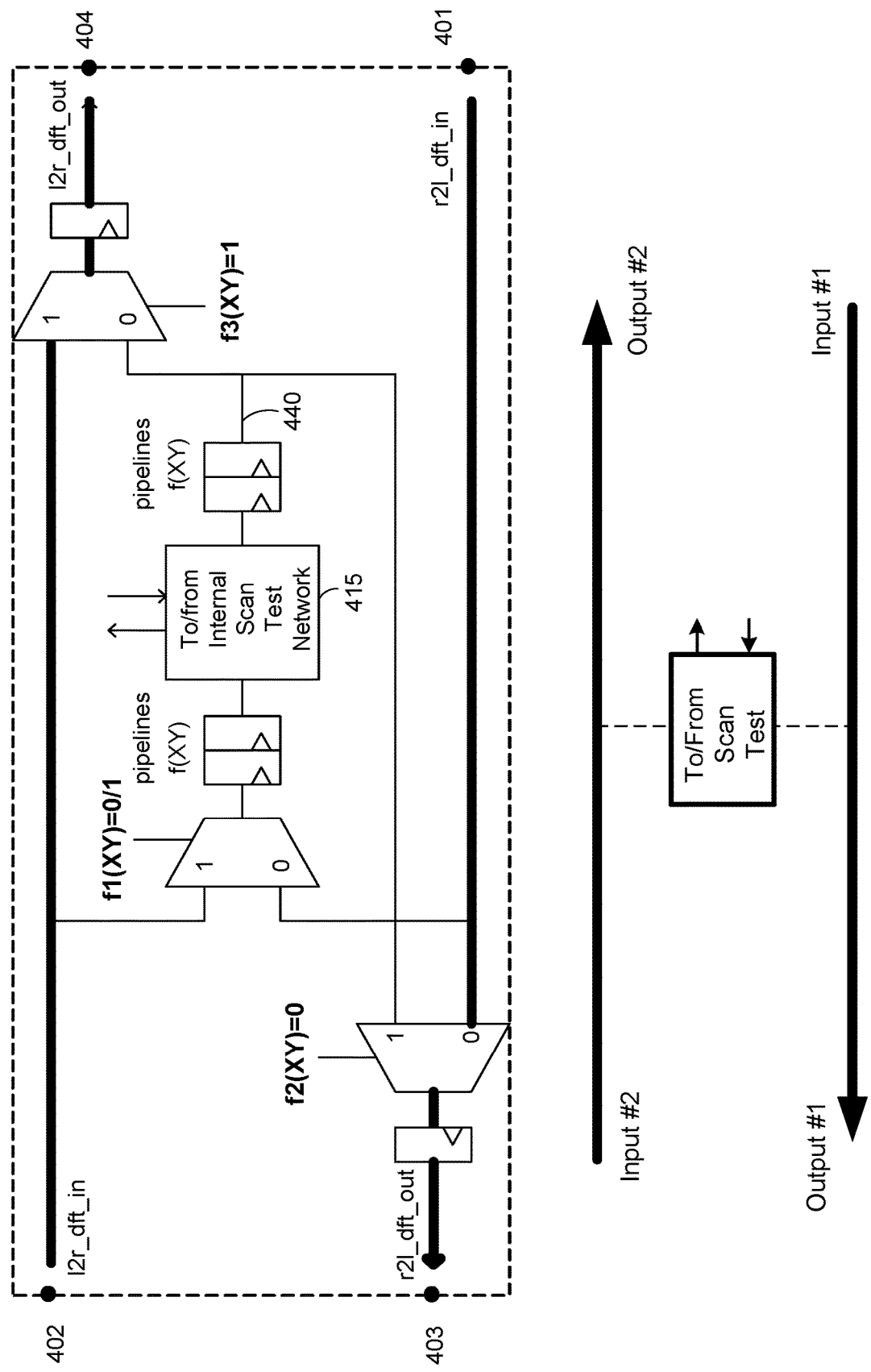

FIG. 5E is a schematic diagram illustrating a scan channel switch configuration for two feed-through scan channels, according to certain aspects of the disclosure. A simplified schematic diagram of scan channel switch 400 of FIG. 4 is reproduced in an upper part of FIG. 5E, in which the activated connections are shown in thick lines. The first selection signal f1(XY) is can be a "0" or a "1" and, scan-in test data from either input node 401 or input node 402 is connected to scan test interface circuit 415. However, the scan test result is not checked or observed. Further, the second selection signal f2(XY) is a "0," indicating that scan-in test data from the first input node 401 is connected to the first output node 403. Moreover, the third selection signal f3(XY) is a "1," indicating that scan-in test data from the second input node 402 is connected to the second output node 404. A simplified schematic is shown in the lower part of FIG. 5E illustrating the configuration described above. It can be seen that a scan channel feed-through connection is formed between Input #1 and Output #1, allowing that scan channel to be used in another circuit cell. Further, a scan channel feed-through connection is formed between Input #2 and Output #2, allowing that scan channel to be used in another circuit cell.

Figure 5F:
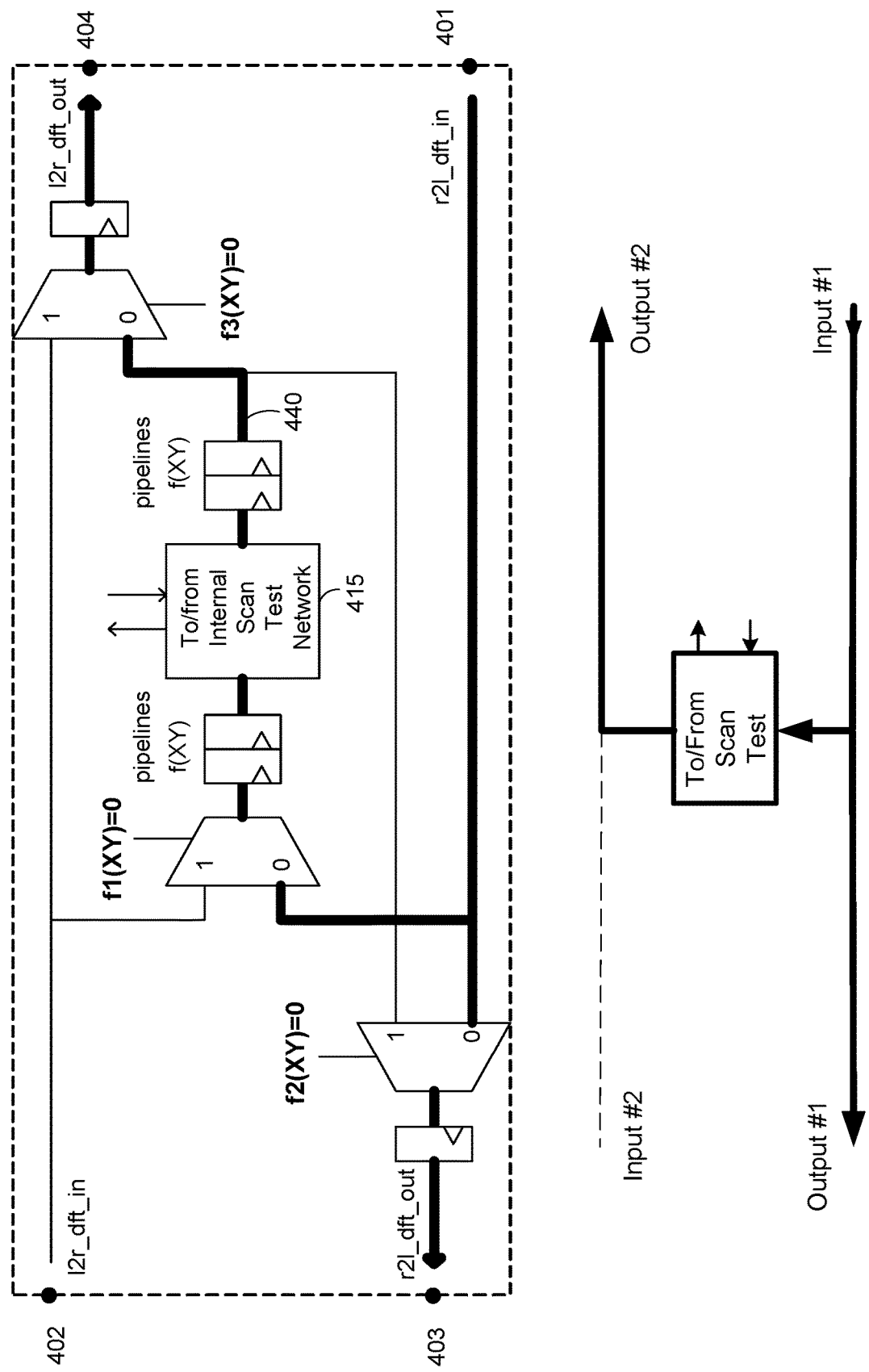

FIG. 5F is a schematic diagram illustrating a scan channel switch configuration for receiving scan-in test data from the right side of the circuit cell and returning scan-out test result data to the right side, and also to pass scan-in test data from the right side to the circuit cell to the left, according to certain aspects of the disclosure. A simplified schematic diagram of scan channel switch 400 of FIG. 4 is reproduced in an upper part of FIG. 5F, in which the activated connections are shown in thick lines. It can be seen that the first selection signal f1(XY) is a "0," and, therefore, scan-in test data from the first input node 401 is connected to scan test interface circuit 415 for coupling to an internal scan test circuit. Further, the third selection signal f3(XY) is a "0," and the output 440 from the scan test interface circuit 415 is connected to the second output node 403. Moreover, the second selection signal f2(XY) is a "0," indicating that scan-in test data from the first input node 401 is connected to the first output node 403. A simplified schematic is shown in the lower part of FIG. 5F illustrating the configuration described above. It can be seen that scan-in test data from the first input input #1 from the right side is delivered to the internal scan test circuit, and the scan-out test result data is transmitted to the second output Output #2 on the right side. Moreover, a scan channel feed-through connection is formed between Input #1 and Output #1. This configuration allows the same scan-in test data to be shared with circuit cells to the left.

Figure 5G:
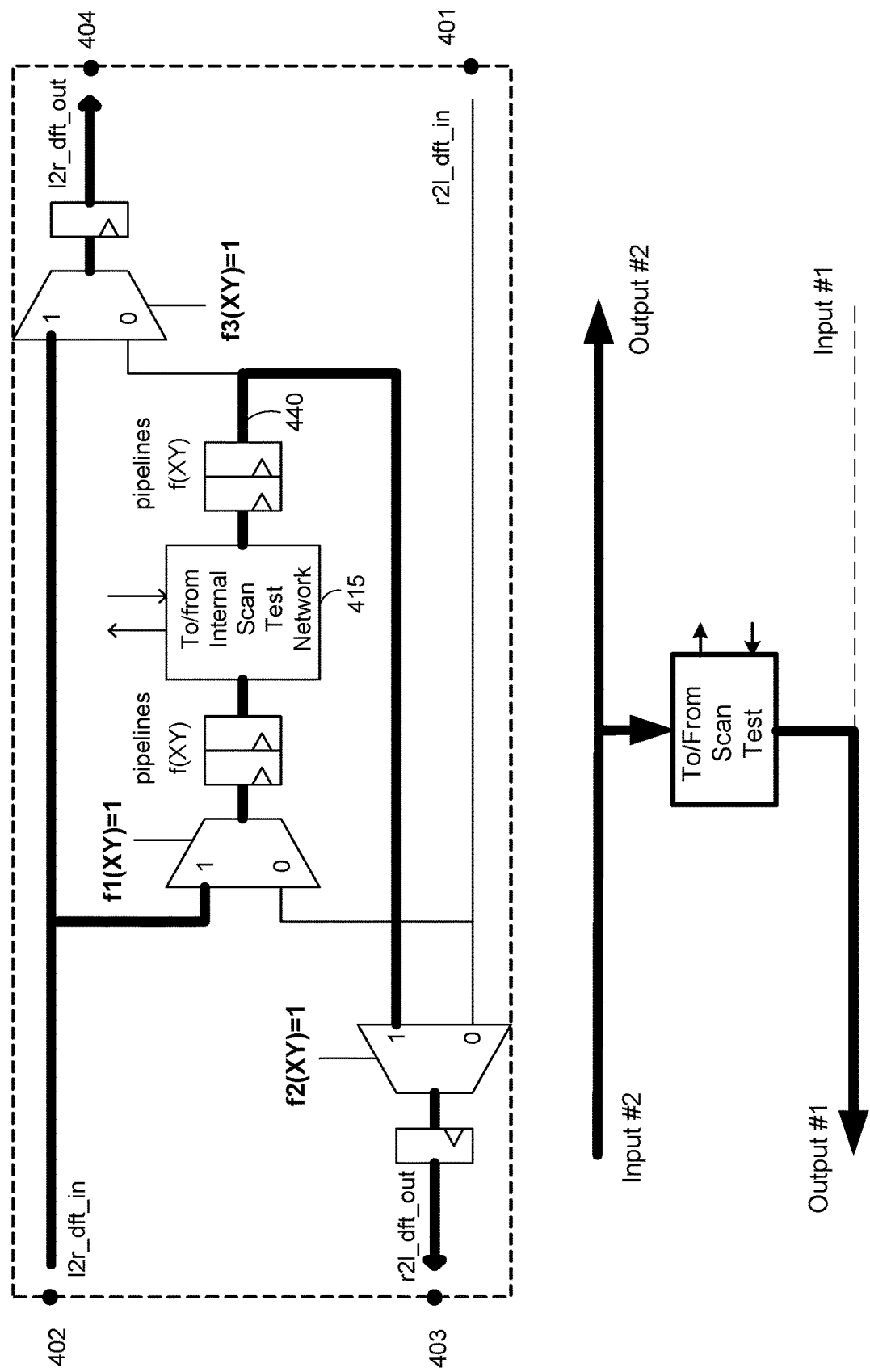

FIG. 5G is a schematic diagram illustrating a scan channel switch configuration for receiving scan-in test data from the left side of the circuit cell and returning scan-out test result data to the left side, and also passing scan-in test data from the left side to the circuit cell to the right, according to certain aspects of the disclosure. A simplified schematic diagram of scan channel switch 400 of FIG. 4 is reproduced in an upper part of FIG. 5G, in which the activated connections are shown in thick lines. It can be seen that the first selection signal f1(XY) is a "1," and, therefore, scan-in test data from the second input node 402 is connected to scan test interface circuit 415 for coupling to an internal scan test circuit. Further, the third selection signal f2(XY) is a "1," and the output 440 from the scan test interface circuit 415 is connected to the second output node 404. Moreover, the second selection signal f2(XY) is a "0," indicating that scan-in test data from the first input node 401 is connected to the first output node 403. A simplified schematic is shown in the lower part of FIG. 5G illustrating the configuration described above. It can be seen that scan-in test data from the second input input #2 from the left of the circuit cell is delivered to the internal scan test circuit, and the scan-out test result data is transmitted to the first output Output #1 on the left. Further, a scan channel feed-through connection is formed between Input #2 and Output #2. This configuration allows the same scan-in test data to be shared with circuit cells to the right.

As described above, FIGS. 5A-5G are schematic diagrams illustrating various configurations of the configurable scan channel switch according to certain aspects of the disclosure. These configurations can be used in a tiled arrangement of circuit tiles for forming various scan channel configurations. Some examples are illustrated below.

FIGS. 6A-6G are schematic diagrams illustrating scan channel configurations for a tiled placement of two abutted circuit tiles, according to certain aspects of the disclosure.

Figure 6A:
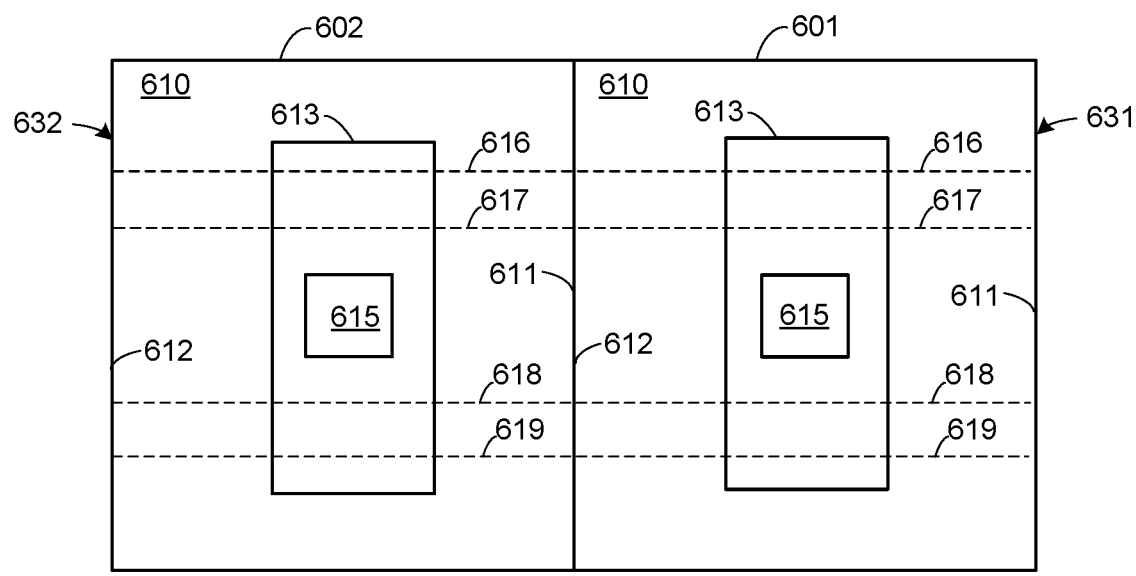
FIGS. 6A-6G are schematic diagrams illustrating scan channel configurations for a tiled placement of two abutted circuit tiles, according to certain aspects of the disclosure.

FIG. 6A is a schematic diagram illustrating a tiled placement of two abutted circuit tiles, according to certain aspects of the disclosure. FIG. 6A illustrates a portion of an integrated circuit block that includes multiple circuit tiles disposed in a tiled arrangement. Each of the circuit tiles is an instance of a circuit cell 610. For example, in FIG. 6A, circuit tiles 601 and 602 are instances of a circuit cell 610. Circuit tiles 601 and 602 are disposed in a tiled arrangement between a first boundary 631 and a second boundary 632. Circuit cell 610 has a first edge 611 and a second edge 612. The circuit cell 610 has a scan channel circuit that includes a configurable scan channel switch 613 and scan channels 614-617 extending between the first edge 611 and the second edge 612 of the circuit cell through the scan channel switch 613. Circuit cell 610 also has a scan test interface circuit 615 for coupling to an internal scan test circuit (not shown). It can be seen that respective scan channels 616-619 in the circuit tiles 601 and 602 are joined together at the shared edges and extend between the first boundary 631 and the second boundary 632 of the circuit block. For example, scan channel 616 in circuit tile 601 and scan channel 616 in circuit tile 602 are joined together at the shared edge, i.e., edge 612 of circuit tile 601 and edge 611 of circuit tile 602. Each circuit tile is configurable to receive scan-in test data from a scan channel extending to either the first boundary 631 or the second boundary 632, and to output scan-out result data of the circuit tile to a scan channel extending to either the first boundary 634 or the second boundary 635. Examples of various configurations are shown in FIGS. 6B-6G.

In FIG. 6A, four scan channels are drawn as an example. However, the number of scan channels can vary, depending on the circuit design and application. In an example, there can be two sets of scan channel configuration circuits described above. Each set has two channels and three multiplexers, with additional selection circuits for connecting the selected scan channels to the scan test circuit. In this approach, two scan channels and three selection circuits are used for each circuit cell. In an alternative embodiment, a scan channel configuration circuit can be modified with more selection circuits (multiplexers) to select scan channels, such that each scan channel extending from right to left or left to right can be configured, with additional selection circuits to select to connect the selected scan channels to the scan test circuit. In FIGS. 6B-6G, examples of possible configurations are illustrated using the scan channel configurations described in FIGS. 3, 4, and 5A-5G.

Figure 6B:
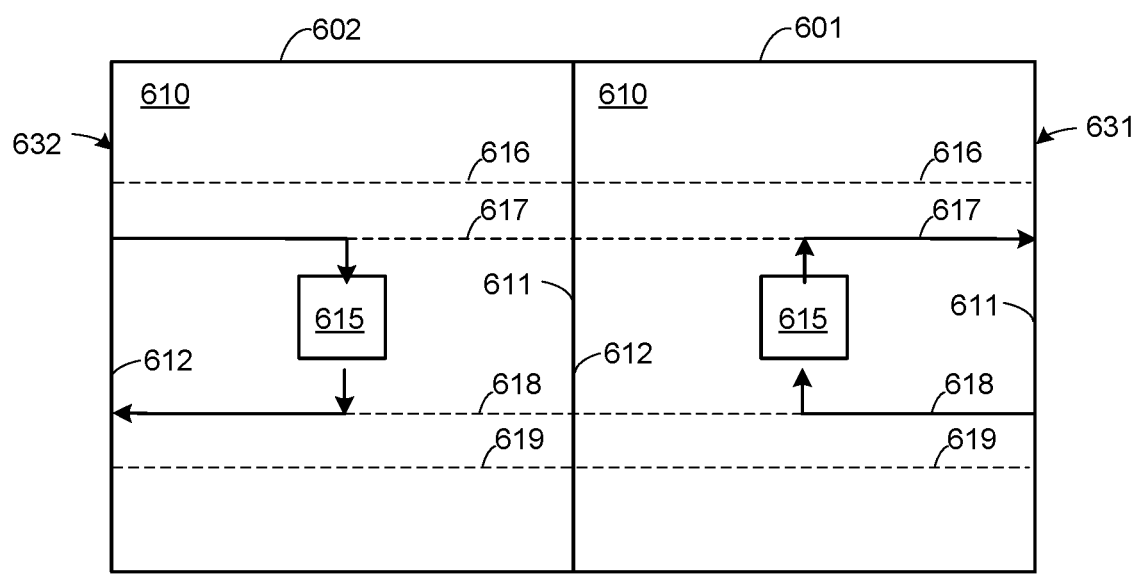

FIG. 6B is a schematic diagram illustrating a scan channel configuration for a tiled placement of two abutted circuit tiles using two scan channels, according to certain aspects of the disclosure. Scan channels in each of the circuit tiles 601 and 602 are configured for each circuit tile 601 and 602 to receive scan-in data and to output scan-out data to a boundary close to the particular circuit tile. Circuit tile 601 has a scan channel configuration according to the configuration illustrated in FIG. 5A, and circuit tile 602 has a scan channel configuration according to the configuration illustrated in FIG. 5B. In FIG. 6B, only two scan channels 617 and 618 in each of circuit tiles 601 and 602 are used.

Figure 6C:
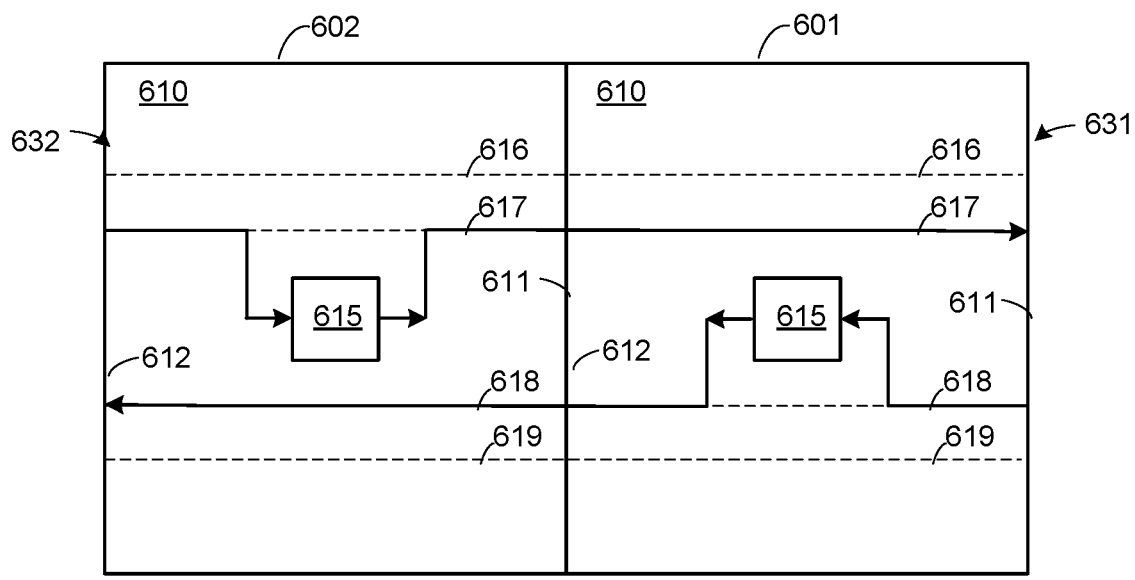

FIG. 6C is a schematic diagram illustrating another scan channel configuration for a tiled placement of two abutted circuit tiles using two scan channels, according to certain aspects of the disclosure. Scan channels in each of the circuit tiles 601 and 602 are configured for each circuit tile 601 and 602 to receive scan-in data from one of the boundaries and to output scan-out data to the opposite boundary. Circuit tile 601 receives scan-in data from boundary 634 and outputs scan-out data to the opposite boundary 635. Circuit tile 602 receives scan-in data from boundary 635 and outputs scan-out data to the opposite boundary 634. Circuit tile 601 has a scan channel configuration according to the configuration illustrated in FIG. 5D, and circuit tile 602 has a scan channel configuration according to the configuration illustrated in FIG. 5C. In circuit tile 601, scan channel 618 is used for scan tests, and scan channel 617 is configured as a pass-through channel for circuit tile 602. Similarly, in circuit tile 602, scan channel 617 is used for scan tests, and scan channel 618 is configured as a pass-through channel for circuit tile 602. In FIG. 6C, only two scan channels 617 and 618 in each of circuit tiles 601 and 602 are used.

Figure 6D:
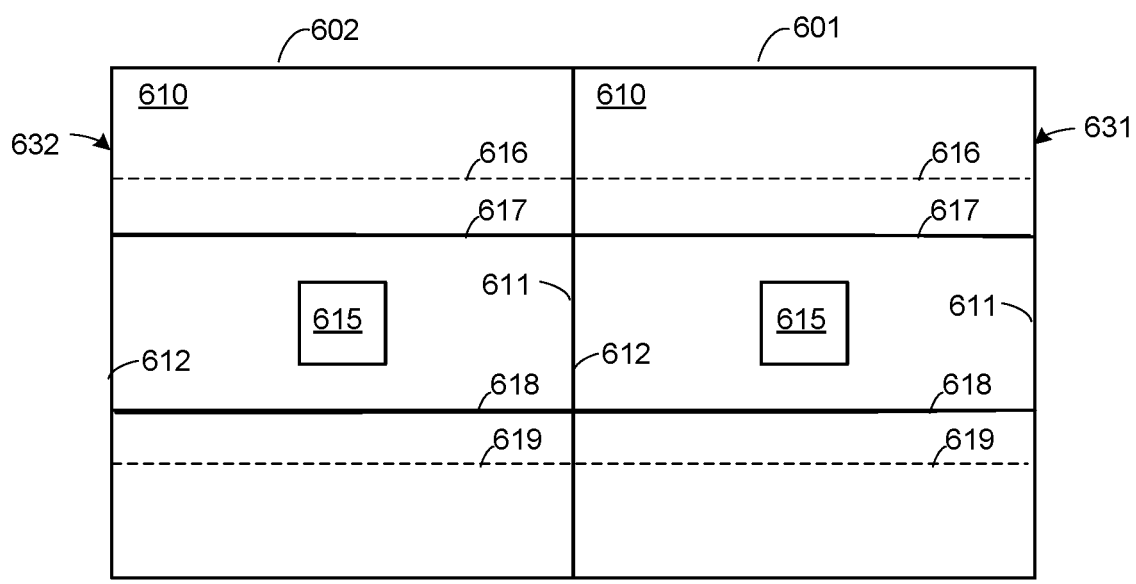

FIG. 6D is a schematic diagram illustrating another scan channel configuration for a tiled placement of two abutted circuit tiles using two scan channels, according to certain aspects of the disclosure. Scan channels in each of the circuit tiles 601 and 602 are configured as pass-through connections for each circuit tile 601 and 602, and no scan test is performed. Circuit tiles 601 and 602 have scan channel configurations according to the configuration illustrated in FIG. 5D, and circuit tile 602 has a scan channel configuration according to the configuration illustrated in FIG. 5E. In circuit tile 601, scan channels 617 and 618 are configured as a pass-through channel for circuit tile 602. Similarly, in circuit tile 602, scan channels 617 and 618 are configured as a pass-through channel for circuit tile 602. The pass-through connections can be used in other circuit tiles in a tiled circuit block having more than two circuit tiles, as described in examples below.

Figure 6E:
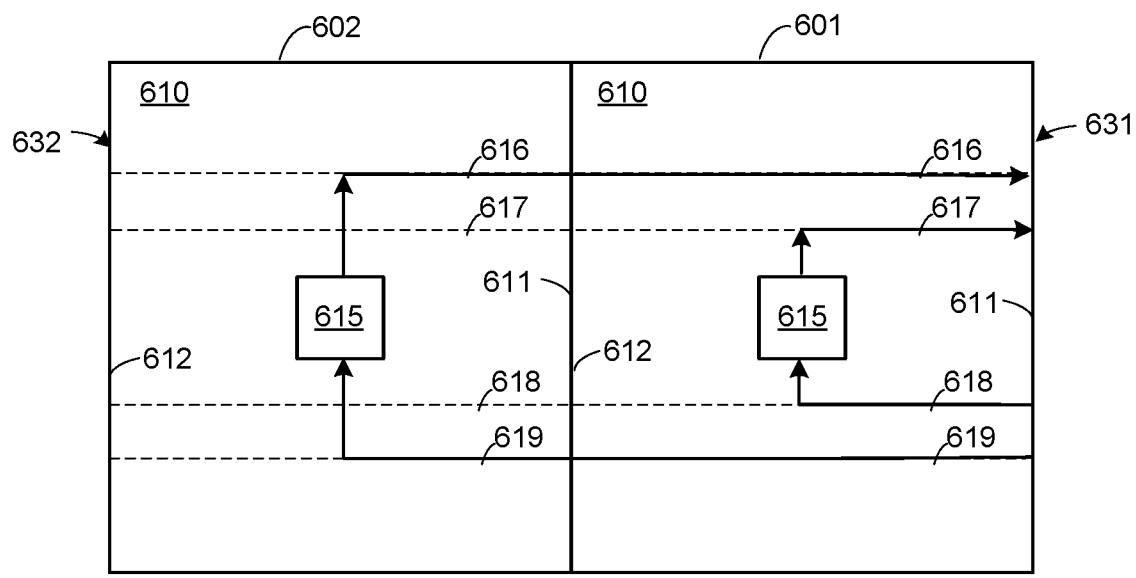

FIG. 6E is a schematic diagram illustrating another scan channel configuration for a tiled placement of two abutted circuit tiles using four scan channels, according to certain aspects of the disclosure. Scan channels in each of the circuit tiles 601 and 602 are configured for each circuit tile 601 and 602 to receive scan-in data from one of the boundaries and to output scan-out data to the same boundary. Both circuit tiles 601 and 602 receive scan-in data from boundary 631 and outputs scan-out data to the same boundary 631. Circuit tiles 601 and 602 have scan channel configuration according to the configuration illustrated in FIG. 5A. In FIG. 6E, four scan channels 616-619 in each of circuit tiles 601 and 602 are used. In circuit tile 601, scan channels 616 and 619 are configured as a pass-through channel for circuit tile 602. Similarly, in circuit tile 602, scan channels 617 and 618 are not selected in a circuit tile to the left.

Figure 6F:
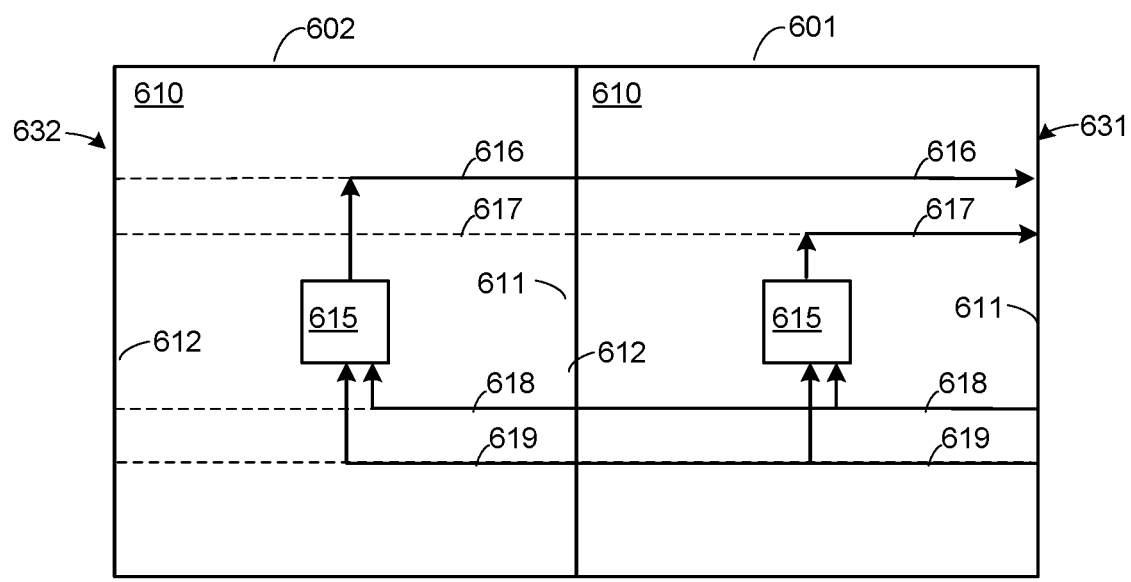

FIG. 6F is a schematic diagram illustrating another scan channel configuration for a tiled placement of two abutted circuit tiles using four scan channels, according to certain aspects of the disclosure. As shown in FIG. 6F, scan channels in each of the circuit tiles 601 and 602 are configured for each circuit tile 601 and 602 to receive scan-in data from one of the boundaries and to output scan-out data to the same boundary. Similar to the configuration in FIG. 6E, both circuit tiles 601 and 602 in FIG. 6F receive scan-in data from boundary 631 and outputs scan-out data to the same boundary 631. However, in FIG. 6F, both circuit tiles 601 and 602 share the same scan-in data from both scan channels 618 and 619, providing more bandwidth for scan-in data. On the other hand, separate scan channels, 616 and 617, are provided to allow for parallel testing.

Figure 6G:
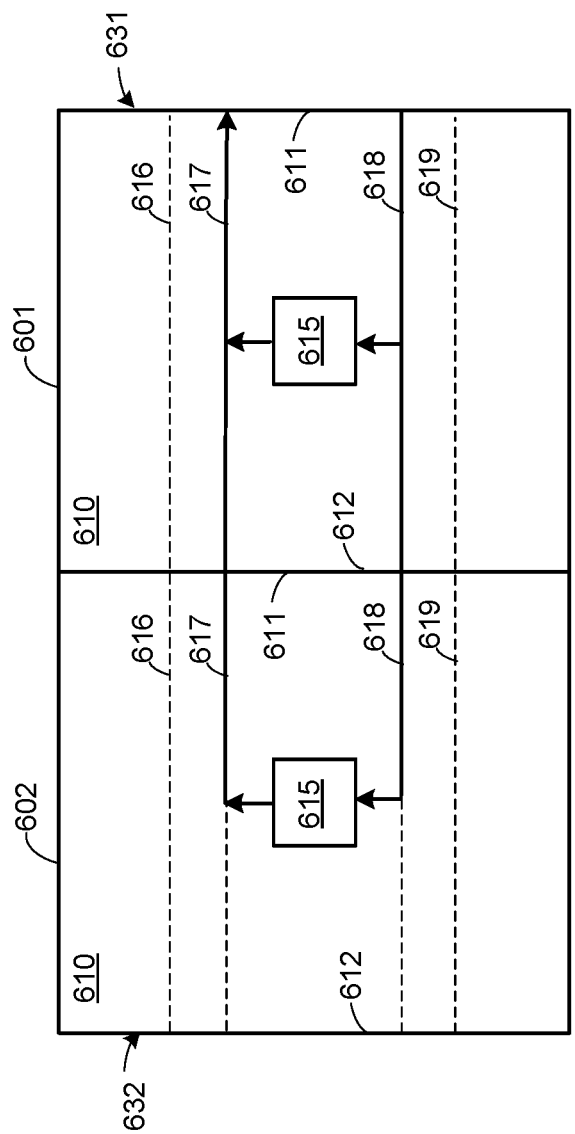

FIG. 6G is a schematic diagram illustrating another scan channel configuration for a tiled placement of two abutted circuit tiles using two scan channels, according to certain aspects of the disclosure. Scan channels in each of the circuit tiles 601 and 602 are configured for each circuit tile 601 and 602 to receive scan-in data from one of the boundaries and to output scan-out data to the same boundary. Similar to the configuration in FIG. 6E, both circuit tiles 601 and 602 in FIG. 6G receive scan-in data from boundary 634 and outputs scan-out data to the same boundary 634. On the other, in FIG. 6G, both circuit tiles 601 and 602 use the same scan channel 618 to receive scan-in data, and use the scan channel 617 to output scan-out data. Therefore, circuit tiles 601 and 602 are configured for scheduled access.

FIGS. 7A-7D are schematic diagrams illustrating scan channel configurations for a tiled placement of three abutted circuit tiles, according to certain aspects of the disclosure.

Figure 7A:
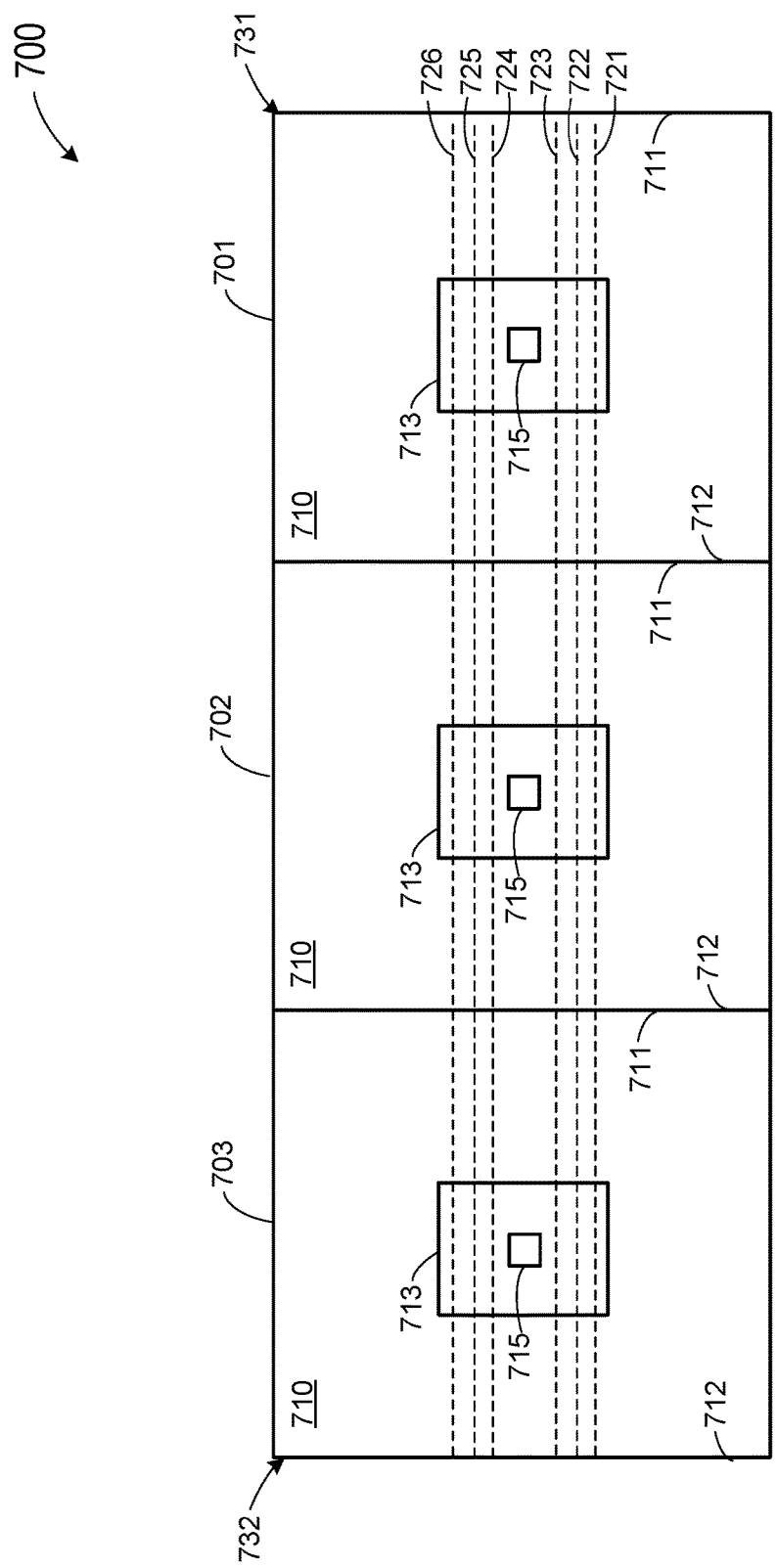
FIGS. 7A-7D are schematic diagrams illustrating scan channel configurations for a tiled placement of three abutted circuit cells, according to certain aspects of the disclosure.

FIG. 7A illustrates a portion 700 of an integrated circuit device that includes three circuit tiles disposed in a tiled arrangement. Each of circuit tiles is an instance of a circuit cell 710. For example, in FIG. 7A, circuit tiles 701, 702, and 703 are instances of a circuit cell 710. Circuit tiles 701-703 are disposed in a tiled arrangement between a first boundary 731 and a second boundary 732. Circuit cell 710 has a first edge 711 and a second edge 712. The circuit cell 710 has a scan channel circuit that includes a configurable scan channel switch 713 and scan channels 721-726 extending between the first edge 711 and the second edge 712 of the circuit cell through the scan channel switch 713. Circuit cell 710 also has a scan test interface circuit 715 for coupling to an internal scan test circuit (not shown). It can be seen that respective scan channels 721-726 in the circuit tiles 701-703 are joined together at the shared edges and extend between the first boundary 731 and the second boundary 732. For example, scan channel 721 in circuit tiles 701-703 are joined together at the shared edges. Each circuit tile is configurable to receive scan-in test data from a scan channel extending to either the first boundary 731 or the second boundary 732, and to output scan-out result data of the circuit tile to a scan channel extending to either the first boundary 731 or the second boundary 732. Examples of various configurations are shown in FIGS. 7B-7D.

Figure 7B:
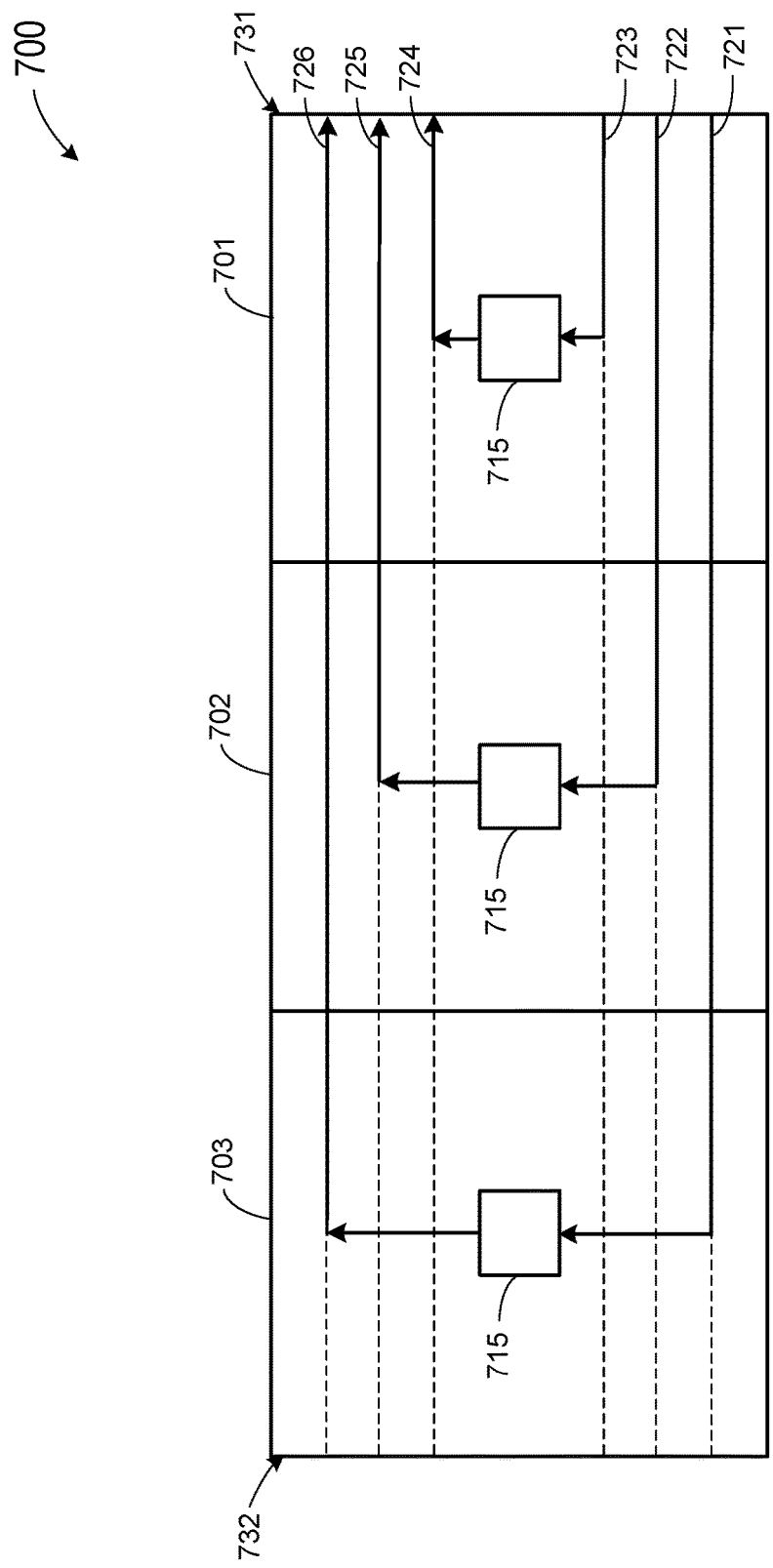

FIG. 7B is a schematic diagram illustrating a first scan channel configuration for a tiled placement of three abutted circuit tiles, according to certain aspects of the disclosure. As shown in FIG. 7B, scan channels in each of the circuit tiles 701-703 are configured for each circuit tile to receive scan-in data from one of the boundaries and to output scan-out data to the same boundary. All circuit tiles 701-703 receive scan-in data from boundary 731 and outputs scan-out data to the same boundary 731. Each of circuit tiles 701-703 has a scan channel configuration according to the configuration illustrated in FIG. 5A. In FIG. 7B, six scan channels 721-726 in each of circuit tiles 701-703 are used. In circuit tile 701, scan channels 721, 722, 725, and 726 are configured as a pass-through channel for circuit tiles 702 and 703. In circuit tile 702, scan channels 721 and 726 are configured as a pass-through channel for circuit tiles 703. Further, in circuit tiles 702 and 703, scan channels 723 and 724 are not selected by the circuit tiles to the left. Similarly, in circuit tile 703, scan channels 722-725 are not selected by the circuit tiles to the left. This configuration is for optimal test time, with parallel access to all cores, but costs more area for test channels.

Figure 7C:
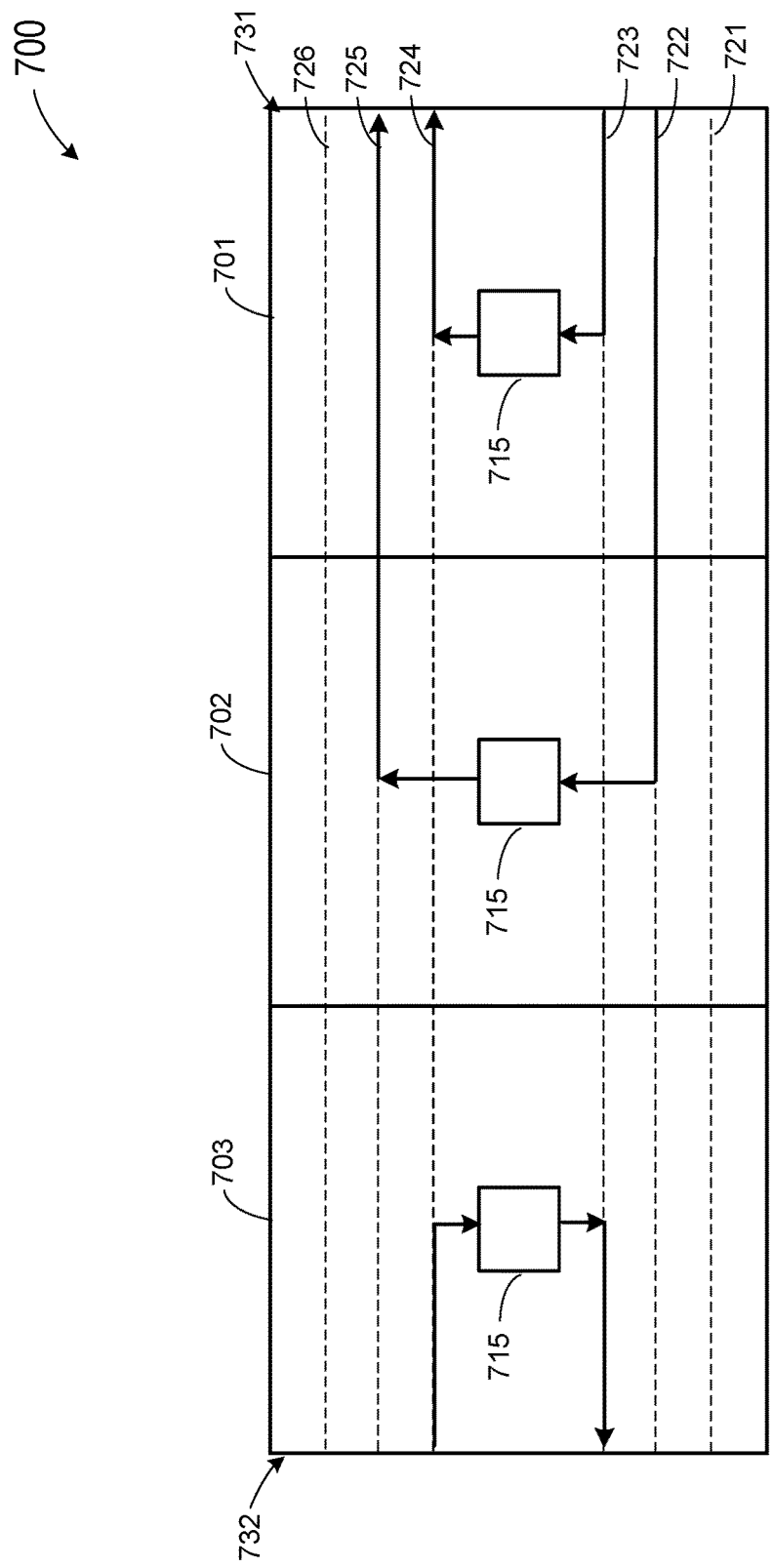

FIG. 7C is a schematic diagram illustrating a second scan channel configuration for a tiled placement of three abutted circuit tiles, according to certain aspects of the disclosure. As shown in FIG. 7C, scan channels in each of the circuit tiles 701 and 702 are configured for each circuit tile to receive scan-in data from one of the boundaries and to output scan-out data to the same boundary. Circuit tiles 701 and 702 in FIG. 7C receive scan-in data from boundary 731 and outputs scan-out data to the same boundary 731, similar to the scan channel configuration described above in connection with 6E. Further, in FIG. 7C, circuit tiles 701 and 703 share the same scan channels 723 and 724. Circuit tile 701 receives scan-in data from boundary 731 and outputs scan-out data to the same boundary 731, and circuit tile 703 receives scan-in data from boundary 732 and outputs scan-out data to the same boundary 732. The scan channel configuration between 701 and 703 is similar to the scan channel configuration described above in connection with 6B. In FIG. 7C, there are also feed-through connections and disconnections, which are not described in detail. In this example, four scan channels are used for a tiled arrangement of three abutted circuit tiles.

Figure 7D:
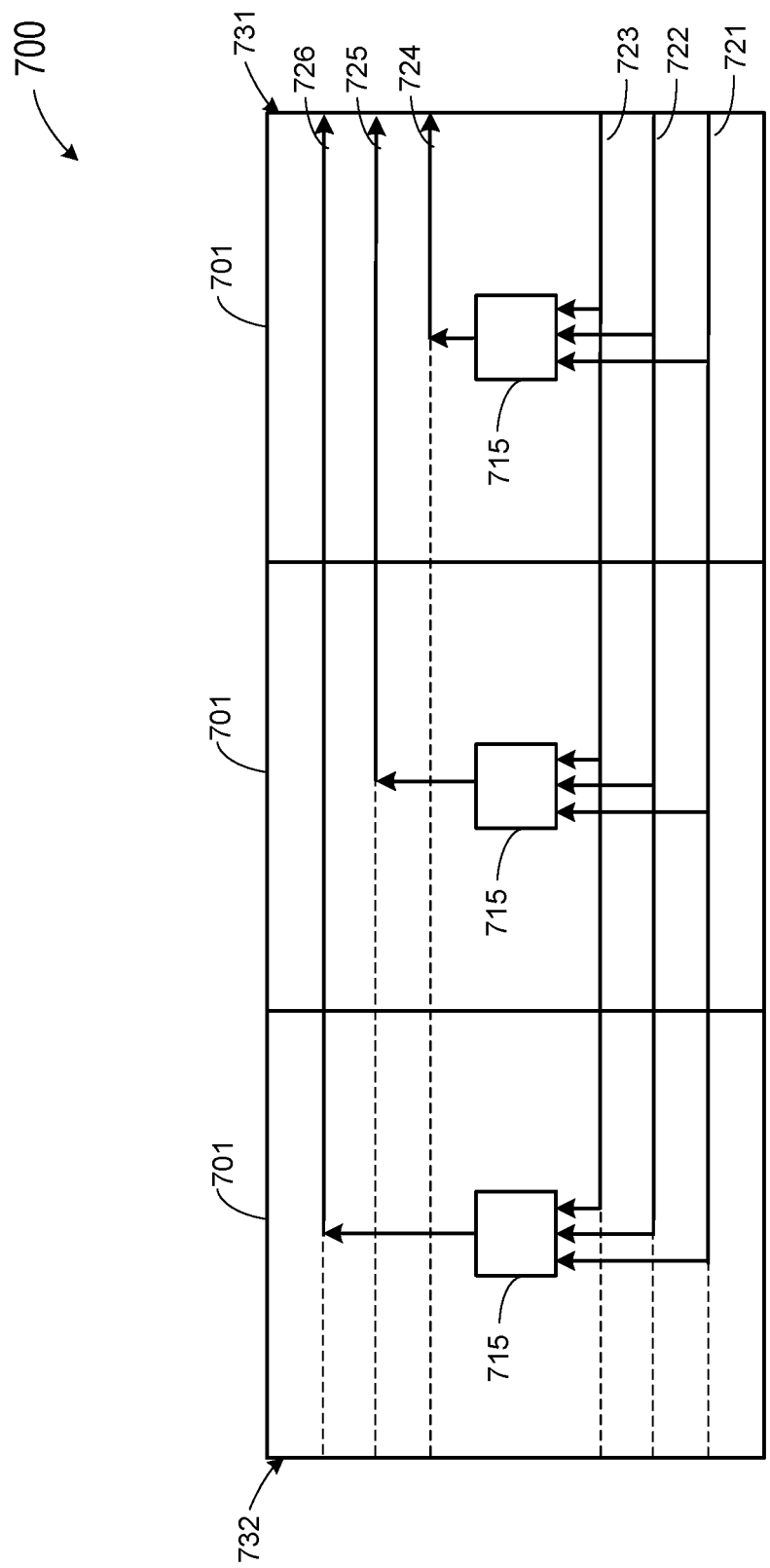

FIG. 7D is a schematic diagram illustrating a third scan channel configuration for a tiled placement of three abutted circuit tiles, according to certain aspects of the disclosure. As shown in FIG. 7D, scan channels in each of the circuit tiles 701-703 are configured for each circuit tile to receive scan-in data from one of the boundaries and to output scan-out data to the same boundary. Similar to the configuration in FIG. 7B, all circuit tiles 701-703 in FIG. 7D receive scan-in data from boundary 731 and output scan-out data to the same boundary 731. However, in FIG. 7D, circuit tiles 701-703 share the same scan-in data from both scan channels 721-723, providing more bandwidth for scan-in data. On the other hand, separate scan channels 724-726 are provided to allow for parallel testing.

Figure 8:
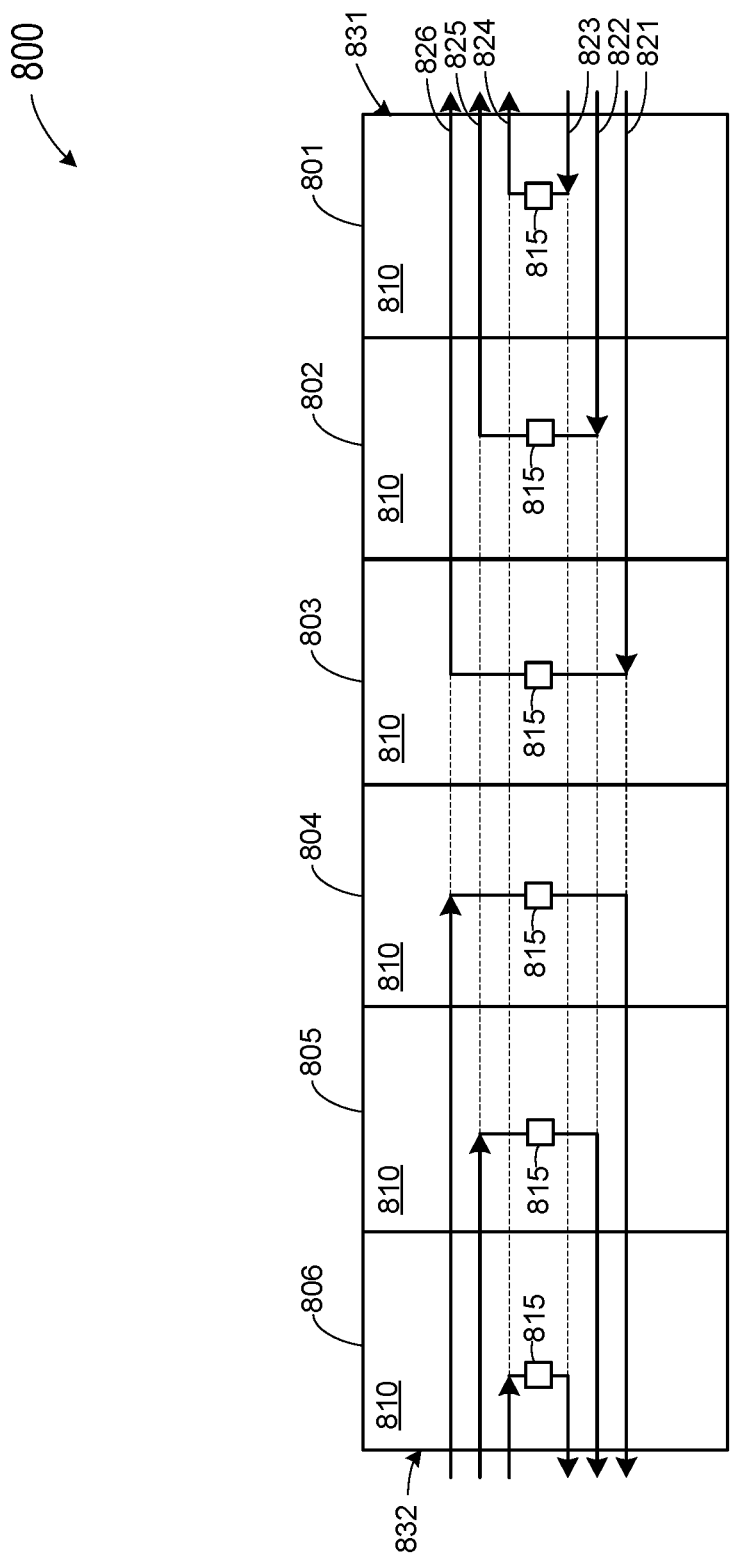
FIG. 8 is a schematic diagram illustrating a scan channel configuration for a tiled arrangement of six instances of circuit tiles, according to certain aspects of the disclosure.

FIG. 8 is a schematic diagram illustrating a scan channel configuration for a tiled arrangement of six instances of circuit tiles, according to certain aspects of the disclosure. FIG. 8 illustrates a circuit block 800 that includes multiple circuit tiles disposed in a tiled arrangement. Each of circuit tiles is an instance of a circuit cell. In FIG. 8, circuit tiles 801-806 are instances of a circuit cell 810. Circuit tiles 801-806 are disposed in an abutted tiled arrangement between a first boundary 832 and a second boundary 832. The circuit cell 810 has a scan channel circuit that includes a configurable scan channel switch (not shown), scan channels 821-826 and a scan test interface circuit 815 for coupling to an internal scan test circuit (not shown). It can be seen that respective scan channels 821-826 in the circuit tiles 801-806 are joined together at the shared edges between circuit tiles and extend between the first boundary 831 and the second boundary 832.

It can be seen in FIG. 8 that circuit tiles 801-803 are configured in a similar fashion as circuit tiles 701-703 in FIG. 7B. As configured, circuit tiles 801-803 receive scan-in test data through scan channels 821-823 from the first boundary 831. Circuit tiles 801-803 output scan-out result data through scan channels 824-826 to the first boundary 831. Further, in circuit tile 801, scan channels 821, 822, 825, and 826 are configured as pass-through connections. Scan channels 821 and 826 in circuit tiles 801 and 802 are also configured as pass-through connections. Scan channels 823 and 824 are not selected in circuit tiles 802 and 803, and scan channels 822 and 824 are not selected in circuit cell 803.

It can be seen in FIG. 8 that circuit tiles 804-806 are configured in a similar fashion as circuit tiles 801-803, but in a mirror image arrangement. As configured, circuit tiles 804-806 receive scan-in test data through scan channels 824-826 from the second boundary 832. Circuit tiles 804-806 output scan-out result data through scan channels 821-823 to the second boundary 832. It can also be seen that circuit tiles 801 and 806 share scan channels 823 and 824. Further, circuit tiles 802 and 805 share scan channels 822 and 825, and circuit tiles 803 and 804 share scan channels 821 and 826. As a result, in this example, six circuit tiles are configured using six scan channels.

In an integrated circuit device, the locations of I/O connections in the device floorplan can vary. Therefore, the configurable scan channel circuits described above can be used to form a network of scan channels in a tiled arrangement of circuit tiles, with each circuit tile having a node in the network of scan channels. Using the various scan channel configurations described above can allow scan channel data to travel through the network of scan channels formed in the circuit tiles in all four directions and change direction at any specific node in the network according to a predefined configuration. For example, various combinations of scan channel configurations described in a circuit tile in FIGS. 5A-5G can be used.

Figure 9:
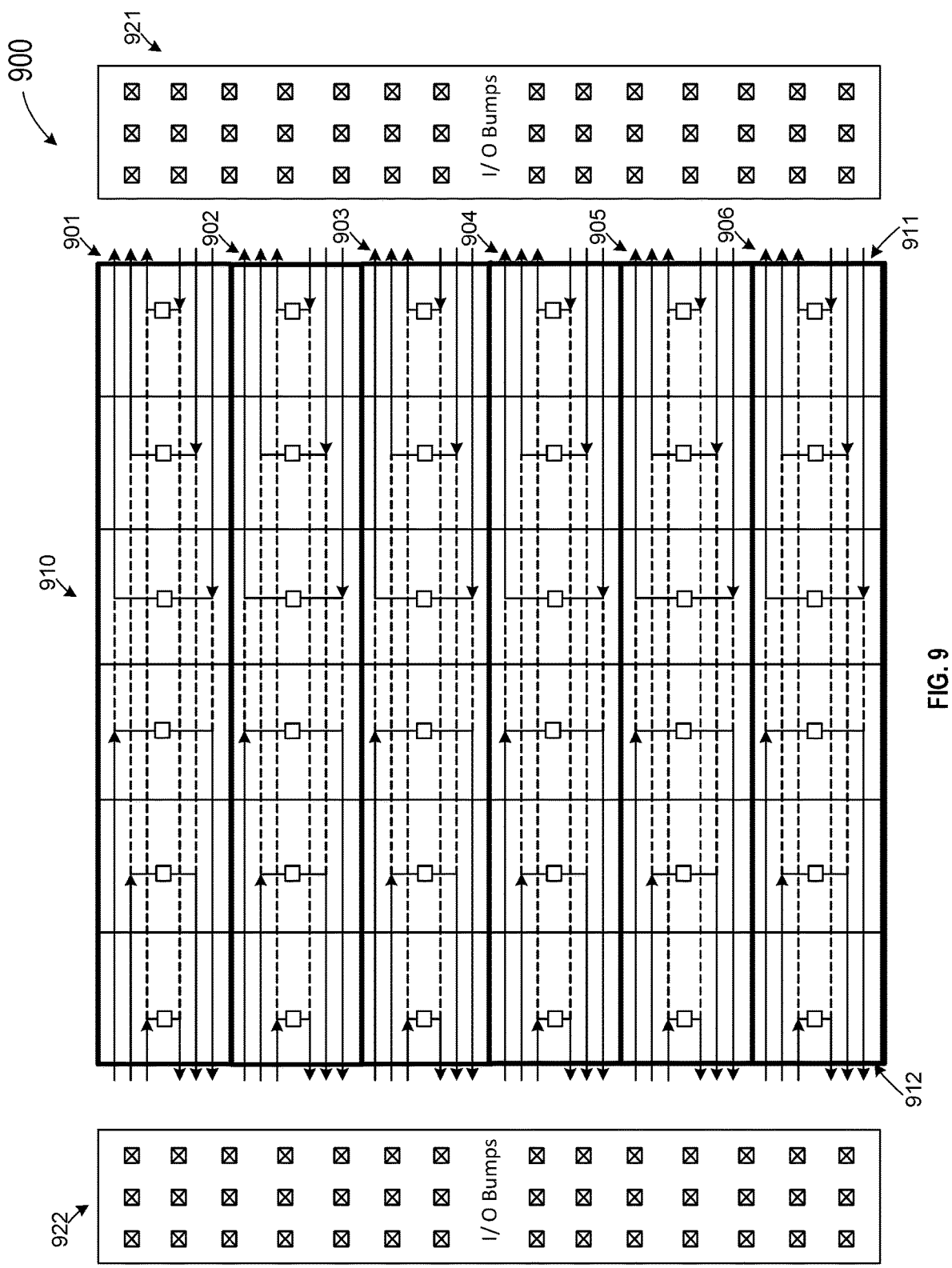
FIG. 9 is a schematic diagram illustrating a portion of an integrated circuit that includes a two-dimensional array of circuit tiles in a tiled arrangement, according to certain aspects of the disclosure.

FIG. 9 is a schematic diagram illustrating a portion of an integrated circuit that includes a two-dimensional array of tiled arrangement of circuit tiles, according to certain aspects of the disclosure. Integrated circuit 900 includes two arrays of I/O bumps 921 and 922, and a two-dimensional array 910 of tiled arrangement of circuit tiles. The two-dimensional array 910 includes 36 circuit tiles which are instances of an identical circuit cell. The 36 circuit tiles are arranged in six circuit blocks 901-906. Each of the six circuit blocks 901-906 is similar to circuit block 800 of FIG. 8 described above. In each of the circuit blocks 901-906, the three circuit tiles on the right hand-side receive scan-in test data and output scan-out data through scan channels that are connected to I/O bumps in the I/O bumps array 921 close to the right boundary 911. Similarly, the three circuit tiles on the left-hand side receive scan-in test data and output scan-out data through scan channels that are connected to I/O bumps in the I/O bumps array 922 close to the left boundary 912.

In this example, given that there is an abundance of I/O ports, and that routing wider busses is possible through the grid, the east-west network bus can be enlarged to three times the minimum width necessary for testing a single circuit tile. Hence, in this configuration, all circuit tiles have direct ATE access and the complete grid can be tested in parallel. Wider physical DFT channels provide parallel test access to all circuit tiles. The test cost can be lowered, at the cost of larger area overhead and higher manufacturing cost. FIG. 9 is only an example of the possible scan channel configurations. Numerous other scan channel configurations can be formed using the configurable scan circuit described above in connection with FIGS. 2-8.

Figure 10A:
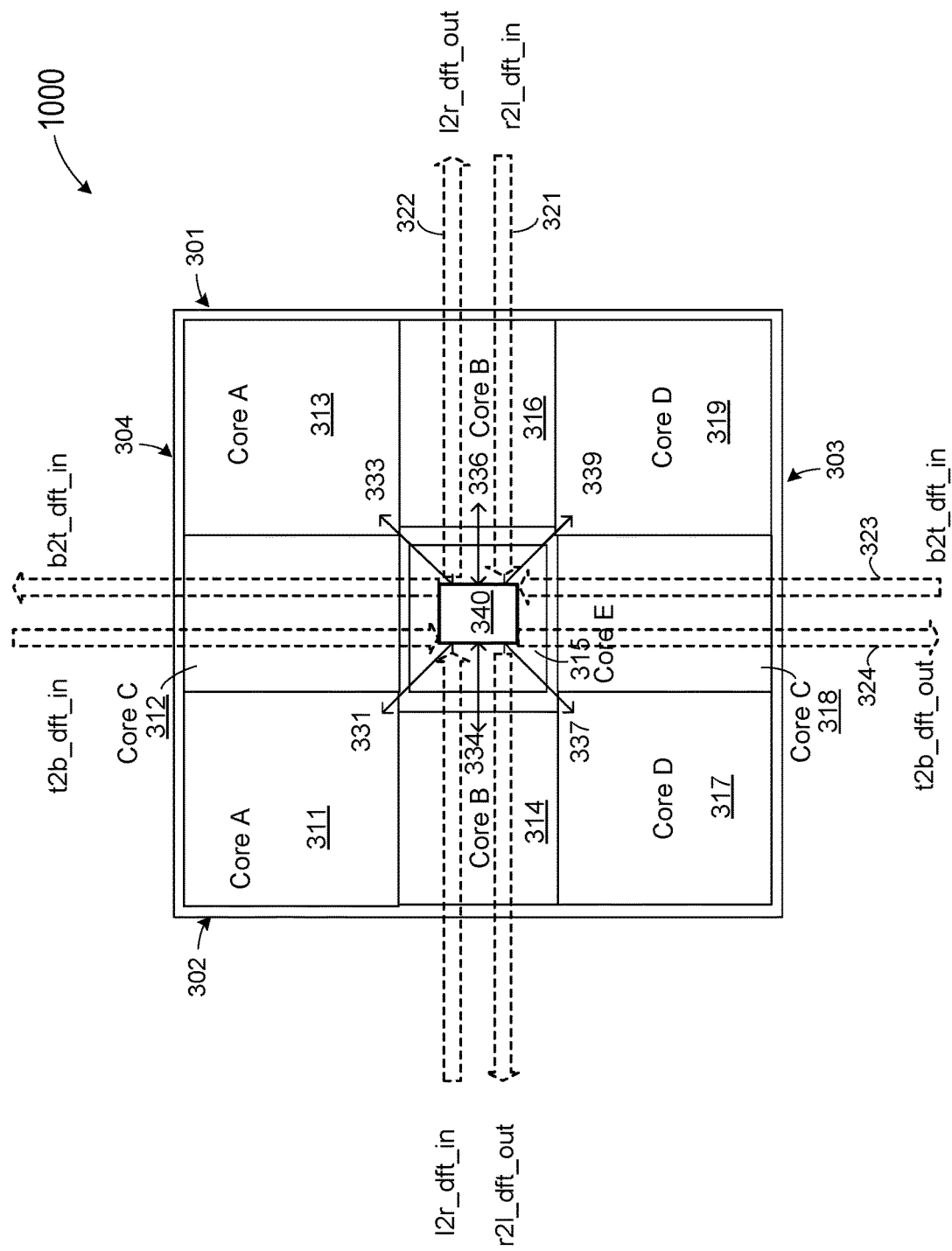
FIG. 10A is a schematic diagram illustrating an exemplary circuit cell including scan channels, according to certain aspects of the disclosure.

FIG. 10A is a schematic diagram illustrating an exemplary circuit cell including scan channels, according to certain aspects of the disclosure. In FIG. 10A, circuit cell 1000 is an example of the circuit cell that can be used to form circuit tiles in the tiled arrangement in FIGS. 2A-8. Circuit cell 1000 represents a design core similar to circuit cell 300 described above in connection with FIG. 3, except that circuit cell 1000 includes four edges and has four scan channels that can be configured to connect between any of the four edges. As shown in FIG. 10A, circuit cell 1000 has a first edge 301, a second edge 302, a third edge 303, and a fourth edge 304. The circuit cell 1000 has a scan channel circuit that can include a configurable scan channel switch 340, scan channels 321 and 322 that extend between the first edge 301 and the second edge 302, and scan channels 323 and 324 that extend between the third edge 303 and the fourth edge 304 of the circuit cell 1000. In FIG. 10A, the scan channel 321 extends in a direction from right to left. Therefore, an input of scan channel 321 is labeled r2l_dft_in, and an output of scan channel 321 is labeled r2l_dft_out, with r2l designating right-to-left. Similarly, the scan channel 322 extends in a direction from left to right. Therefore, an input of scan channel 322 is labeled l2r_dft_in, and an output of scan channel 322 is labeled l2r_dft_out, with l2r designating left-to-right. Similarly, the scan channel 323 extends in a direction from bottom to top. Therefore, an input of scan channel 323 is labeled b2t_dft_in, and an output of scan channel 323 is labeled b2t_dft_out, with b2t designating bottom-to-top. Similarly, the scan channel 324 extends in a direction from top to bottom. Therefore, an input of scan channel 324 is labeled t2b_dft_in, and an output of scan channel 324 is labeled t2b_dft_out, with t2b designating top-to-bottom.

Similar to configurable scan channel switch 320 in FIG. 3, the configurable scan channel switch 340 in FIG. 10A includes a scan test interface circuit (not shown) and selectively couples the scan channels to a scan test circuit in the circuit cell 1000 for receiving scan-in test data for performing scan tests in the circuit cell, and for outputting scan-out test result data from the scan test circuit. Unlike configurable scan channel switch 320 in FIG. 3, configurable scan channel switch 340 in FIG. 10A can handle 4-way scan channel routing, as described below in connection with FIG. 10B. The other circuit blocks are similar to those in circuit cell 300 of FIG. 3, and are not described in detail here.

Figure 10B:
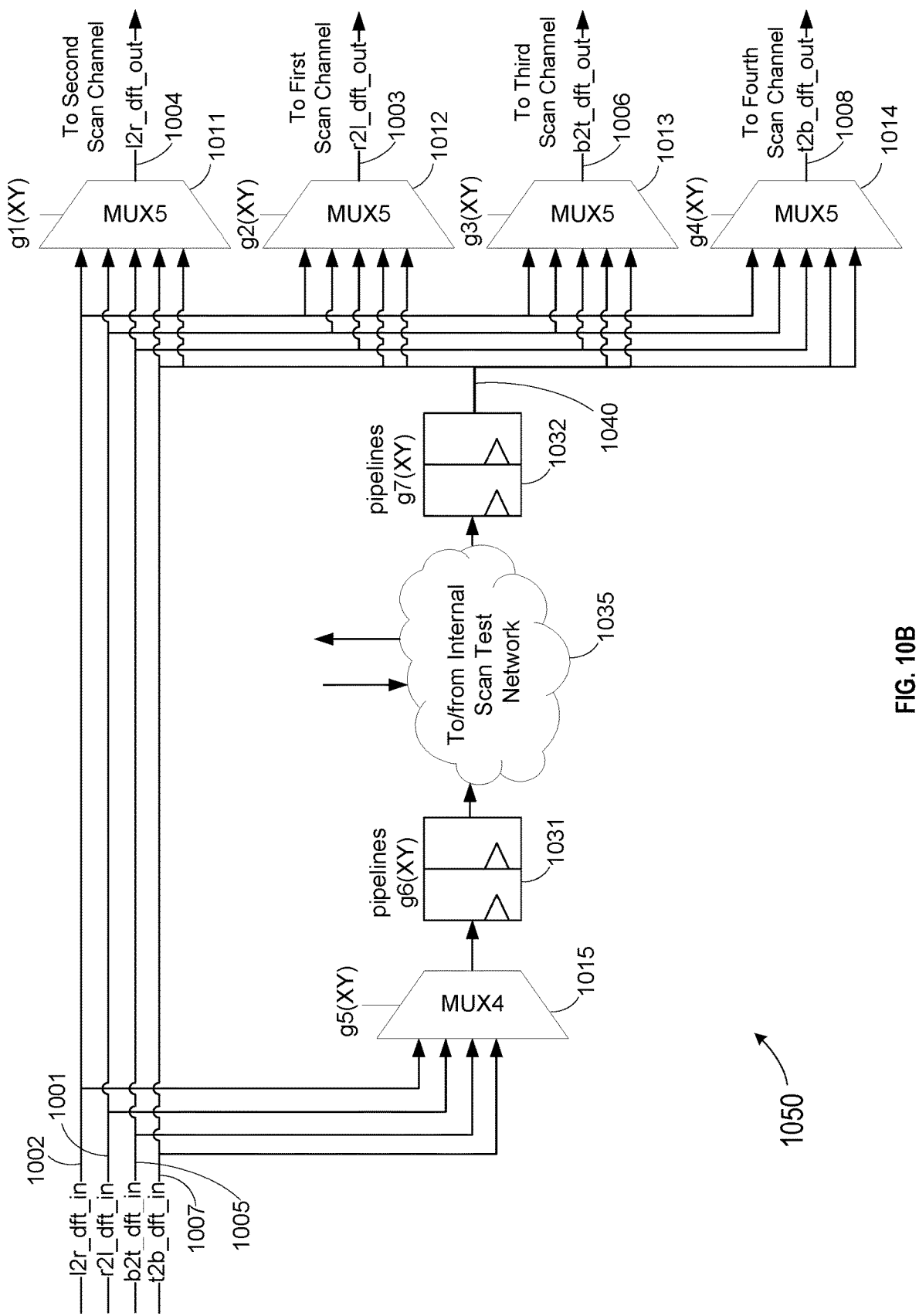
FIG. 10B is a schematic diagram illustrating a configurable scan channel switch in a circuit cell, according to certain aspects of the disclosure.

FIG. 10B is a schematic diagram illustrating a configurable scan channel switch for a circuit cell, according to certain aspects of the disclosure. In FIG. 10B, configurable scan channel switch 1050 can be used in a 4-way the scan channel circuit in circuit cell 1000 in FIG. 10A. This implements a 4-way configurable scan channel arrangement in an integrated circuit, similar to what appears in FIG. 2B. In this example, configurable scan channel switch 1050 is illustrated for configuring four scan channels in the circuit cell. Additional or fewer scan channels can be accommodated by modifying the hardware and control signals of FIG. 10B accordingly.

As shown on the left-hand side of FIG. 10B, configurable scan channel switch 1050 includes input nodes 1001, 1002, 1005, 1007 configured to receive scan-in data from first, second, third, and fourth scan channels, respectively. On the right-hand side of the figure appear output nodes 1003, 1004, 1006, 1008, which are configured to provide output data to the first, second, third, and fourth scan channels, respectively. In the nomenclature of this particular example, the first and second scan channels run left-to-right/right-to-left, while the third and fourth scan channels run up-and-down. Of course, in other embodiments the nomenclature for the channels can be arranged differently. Table 1, below, shows the nomenclature, scan channel, and directions for the input nodes of the example of FIG. 10B. In these labels, "r2l" designates right-to-left, "l2r" designates left-to-right, "b2t" designates bottom-to-top, "t2b" designates top-to-bottom, and "dft" designates "design for testing."

TABLE 1

| Ref. No. | Scan Channel | Signal Label | Direction |
|---|---|---|---|
| 1001 | First | r2l_dft_in | Right-to-left |
| 1002 | Second | l2r_dft_in | Left-to-right |
| 1005 | Third | b2t_dft_in | Bottom-to-top |
| 1007 | Fourth | t2b_dft_in | Top-to-bottom |

As shown in FIG. 10B, scan channel switch 1050 also includes multiple selection circuits 1011-1015 for implementing various scan channel connections in response to respective selection signals g1(XY)-g5(XY), as illustrated in FIG. 10B. In this example, selection circuits 1011-1015 are shown as multiplexers that can selectively couple one of multiple inputs to the output. The selection signals g1(XY)-g5(XY) are examples of configuration input data to the selection circuits. (As in some of the other embodiments described herein, "XY" refers to the location of the particular circuit tile in the IC design.) The selection circuits 1011-1014 can be operated in accordance with their respective selection signals to direct signals from any of the input nodes 1001, 1002, 1005, 1007 to any of the output nodes 1003, 1004, 1006, 1008, as is described in more detail below. Additionally, the selection circuit 1015 can be operated responsive to its selection signal g5(XY) to direct input from any of the input nodes 1001, 1002, 1005, 1007 to a scan test interface circuit 1035, similar to that described in the example of FIG. 4.

In some examples, scan channel switch 1050 can also include pipelines of sampling stages, such as 1031 and 1032, as shown in FIG. 10B and similar to the pipeline stages described for the embodiment of FIG. 4. For this purpose, compensation pipelines 1031 and 1032 are associated with selection signals g6(XY) and g7(XY) to indicate that different compensation pipelines can be used for different circuit files at location (XY) of the integrated circuit. An output 1040 of the pipelines and the scan test interface circuit 1035 is coupled to inputs of each of the selection circuits 1011-1014, thereby allowing outputs of the scan test interface circuit 1035 to be rerouted to any of the output nodes 1003, 1004, 1006, 1008.

Selection signals g1 (XY) to g5(XY), can be chosen such that in each of the circuit tiles, the scan channel circuit can be configurable to receive scan-in test data from any of the first, second, third, and fourth edges of the circuit tile, and to output scan-out result data to any of the first, second, third, and fourth edges of the circuit tile. Similarly, in a tiled arrangement of circuit tiles, selection signals g1 (XY) to g5(XY) can be chosen such that each of the circuit tiles can be configurable to receive scan-in test data from any one of the first boundary, the second boundary, the third boundary, and the fourth boundary of the circuit block, perform a scan test, and to output scan-out result data to any one of the first boundary, the second boundary, the third boundary, and the fourth boundary of the circuit block. An example is illustrated in FIG. 11.

Figure 11:
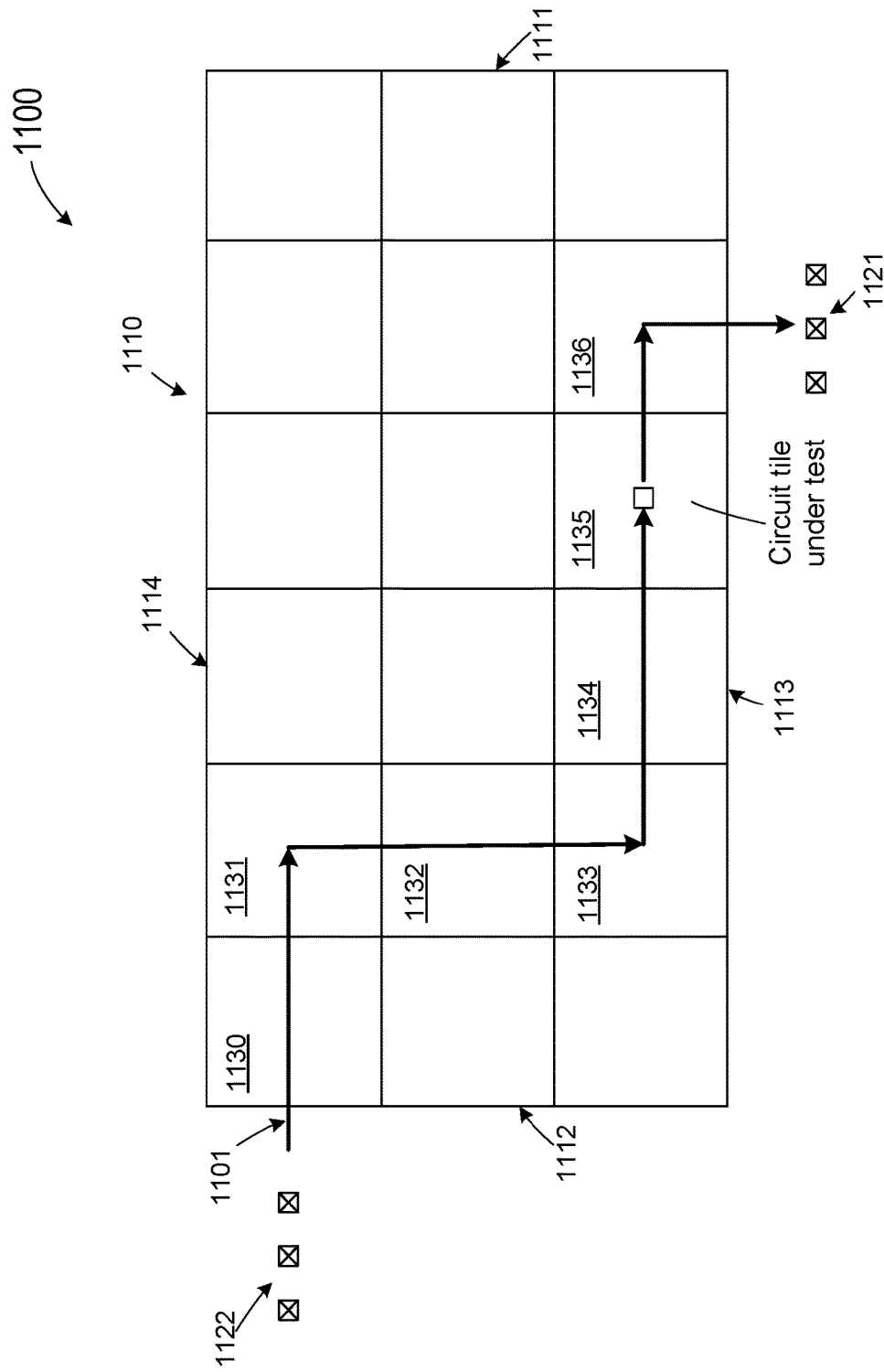
FIG. 11 is a schematic diagram illustrating a portion of an integrated circuit that includes a two-dimensional array of circuit tiles in a tiled arrangement, according to certain aspects of the disclosure.

FIG. 11 is a schematic diagram illustrating a portion of an integrated circuit that includes a two-dimensional array of circuit tiles in a tiled arrangement, according to certain aspects of the disclosure. As shown in FIG. 11, integrated circuit 1100 includes two arrays of I/O bumps 1121 and 1122, and a two-dimensional array 1110 of tiled arrangement of circuit tiles. The two-dimensional array 1110 includes 18 circuit tiles which are instances of an identical circuit cell. The 36 circuit tiles are arranged in a 3×6 two-dimensional array within a first boundary 1111, a second boundary 1112, a third boundary 1113, and a fourth boundary 1114. In this example, a scan channel 1101 is formed to transfer scan-in test data from I/O bumps 1122 to a circuit tile 1130, through circuit tiles 1130, 1131, 1132, 1133, and 1134 to reach a circuit tile under test 1135. After a scan test is performed in circuit tile 1135, the test result scan-out data is transferred from circuit tile 1135, through circuit tile 1136 to reach I/O bumps 1121.

In the example of FIG. 11, each circuit tile has a 4-way configuration scan channel switch and configuration scan channels as described in connection with FIGS. 10A and 10B. Scan channel 1101 can include portions that extend in a left-and-right direction and other portions that extend in an up-and-down direction. In this example, the available I/O ports are limited, and narrower physical scan channels, such as 1101, are formed. In this case, the testing of the circuit tiles along the scan channel 1101 can be scheduled serially, with the scan test performed in one circuit tile at a time. This arrangement may result in higher test time and costs. However, a smaller area overhead and lower manufacturing cost can be achieved.

According to some aspects of the disclosure, a non-transitory computer-readable medium can include instructions stored on the computer-readable medium that, when executed by one or more processors, cause the one or more processors to perform operations including the following:
- adding a circuit cell design to an integrated circuit device design;
- adding a configurable scan channel switch in the circuit cell design;
- adding configurable scan channels between a first edge and a second edge of the circuit cell design;
- forming multiple circuit tiles in the integrated circuit device design, each circuit tile being an instance of the circuit cell design;
- placing the multiple circuit tiles in a tiled arrangement between a first boundary and a second boundary; and
- connecting the configurable scan channels in the multiple circuit tiles together such that the configurable scan channels extend between the first boundary and the second boundary in the integrated circuit design.

As constructed above, the configurable scan channel switch is operable to configure one or more of the configurable scan channels to connect a scan test circuit in a circuit tile of the multiple circuit tiles to receive scan-in test data from either the first boundary or the second boundary, and to output scan-out result data of the circuit tile to either the first boundary or the second boundary.

Examples of computer-readable medium can include various memory device, volatile or non-volatile, portable or non-portable, as described further below in connection with FIGS. 13 and 14. The operations listed above can be summarized in a flowchart in FIG. 12 and further explained below.

Figure 12:
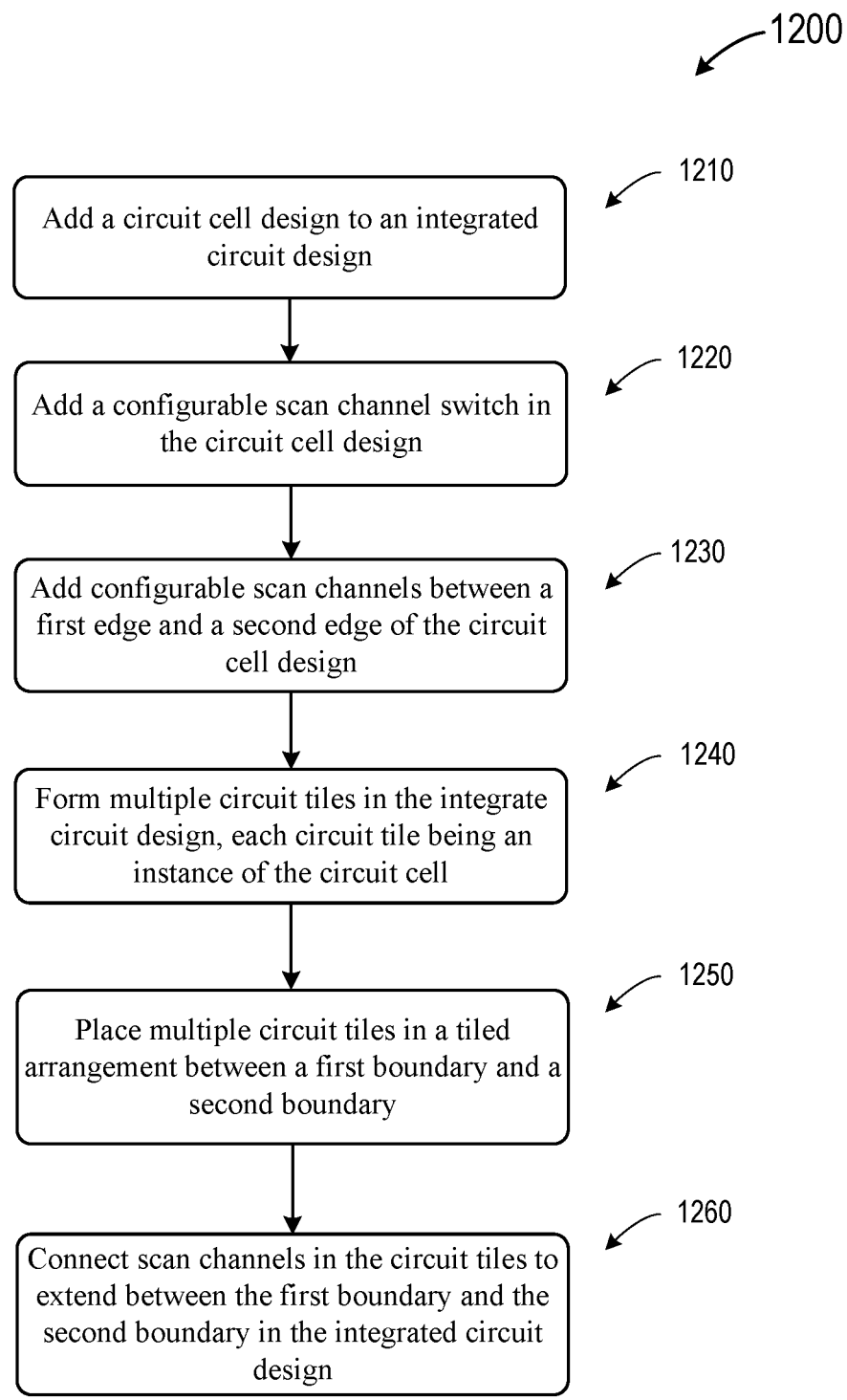
FIG. 12 is a flowchart illustrating a method for forming a design for an integrated circuit, according to certain aspects of the disclosure.

FIG. 12 is a flowchart illustrating a method for forming a design for an integrated circuit, according to certain aspects of the disclosure. The flowchart in FIG. 12 describes a method 1200 for forming an integrated circuit design that includes multiple circuit tiles disposed in a tiled arrangement. The method may incorporate embodiments of the circuits described above in, for example, FIGS. 2A-2B, 5A-5G, 6A-6G, 7A-7D, and 8-11.

At step 1210, a circuit cell design is formed. Examples of circuit cells are described above in connection with FIG. 2. As an example, a circuit cell can be a design core for carrying out a design function. Instances of the circuit cell can be used as part of a larger circuit design.

At step 1220, a configurable scan channel switch is placed in the circuit cell design. At step 1230, configurable scan channels are placed in the circuit cell design. The configurable scan channel switch and configurable scan channels form part of a scan channel circuit. The configurable scan channel switch can include a number of selection circuits to form various connections of the scan channels in response to selection signals. The selection signal can be provided by an external tester or, alternatively, can be provided by a processor in the integrated circuit.

As an example, as shown in FIGS. 3 and 4, the configurable scan channels are placed between a first edge and a second edge of the circuit cell design. Configurable scan channel switch can include a first input node configured to receive scan-in data from a first scan channel, a second input node configured to receive scan-in data from a second scan channel, a first output node for providing scan-out data from the scan test circuit to the first scan channel, and a second output node configured for providing scan-out data from the scan test circuit to the second scan channel. The configurable scan channel switch can also include three selection circuits. A first selection circuit is configured to, in response to a first selection signal, couple an input to the scan test circuit to one of the first input node and the second input node. A second selection circuit is configured to, in response to a second selection signal, couple the first output node to one of an output from the scan test circuit and the first input node. A third selection circuit is configured to, in response to a third selection signal, couple the second output node to one of the outputs from the scan test circuit and the second input node.

As described above, FIGS. 3 and 4 illustrate a circuit cell with a configurable scan channel switch and scan channels that can be used to route scan channels between a first edge and a second edge of the circuit cell. As another example, FIGS. 10A and 10B illustrate a circuit cell with a configurable scan channel switch and scan channels that can be used to route scan channels between any of a first edge, a second edge, a third edge, and a fourth edge of the circuit cell.

At step 1240, multiple circuit tiles are formed in the design, with each circuit tile being an instance of the circuit cell. At step 1250, the multiple circuit tiles are disposed in a tiled arrangement between a first boundary and a second boundary. Examples of tiled arrangements of circuit tiles are described above in, for example, FIGS. 2A-2B, 5A-5G, 6A-6G, 7A-7D, 8-9, and 11.

At step 1260, the configurable scan channels in the multiple circuit tiles are connected together such that the configurable scan channels extend between the first boundary and the second boundary. In an example, the multiple circuit tiles are disposed in an abutted tiled arrangement with edges of adjacent tiles in direct contact. This arrangement causes the scan channels in neighboring tiles to be connected. Examples of abutted tiled arrangements of circuit tiles are described in connection with FIGS. 2A-2B, 5A-5G, 6A-6G, 7A-7D, 8-9, and 11.

In other examples, the circuit tiles may not be abutted to neighboring circuit tiles. In this case, additional connections may be formed to connect the scan channels such that the scan channels can extend between boundaries of the tiled arrangement of circuit tiles.

As described above, the configurable scan channels in the multiple circuit tiles extend between the first boundary and the second boundary of a circuit block of circuit tiles in a tiled arrangement. In this case, the circuit tiles can be configured to receive scan-in data from either the first or second boundary, and to output scan-out data to either the first or second boundary. According to other aspects of the disclosure, the configurable scan channels in the multiple circuit tiles can extend between any of the four boundaries of a circuit block of circuit tiles in a tiled arrangement. In this case, the circuit tiles can be configured to receive scan-in data from any of the four boundaries, and to output scan-out data to any of the four boundaries.

In the description above, the configurable scan channel switch and the configurable scan channels are built in the original circuit cell, and then the instances of the circuit cell are tiled together to form connected scan channels. In another example, the configurable scan channel switch and the configurable scan channels are not built in the circuit cell. In this case, the tiled arrangement of circuit tiles are formed and then the configurable channel switch and the configurable scan channels can be added at a top level to the tiled arrangement of circuit tiles. In still another example, the configurable scan channel switch is built in the circuit cell, and the instances of the circuit cells are used to form the circuit tiles in the tiled arrangement. Subsequently, the configurable scan channels can be added at a top level to the tiled arrangement of circuit tiles.

Figure 13:
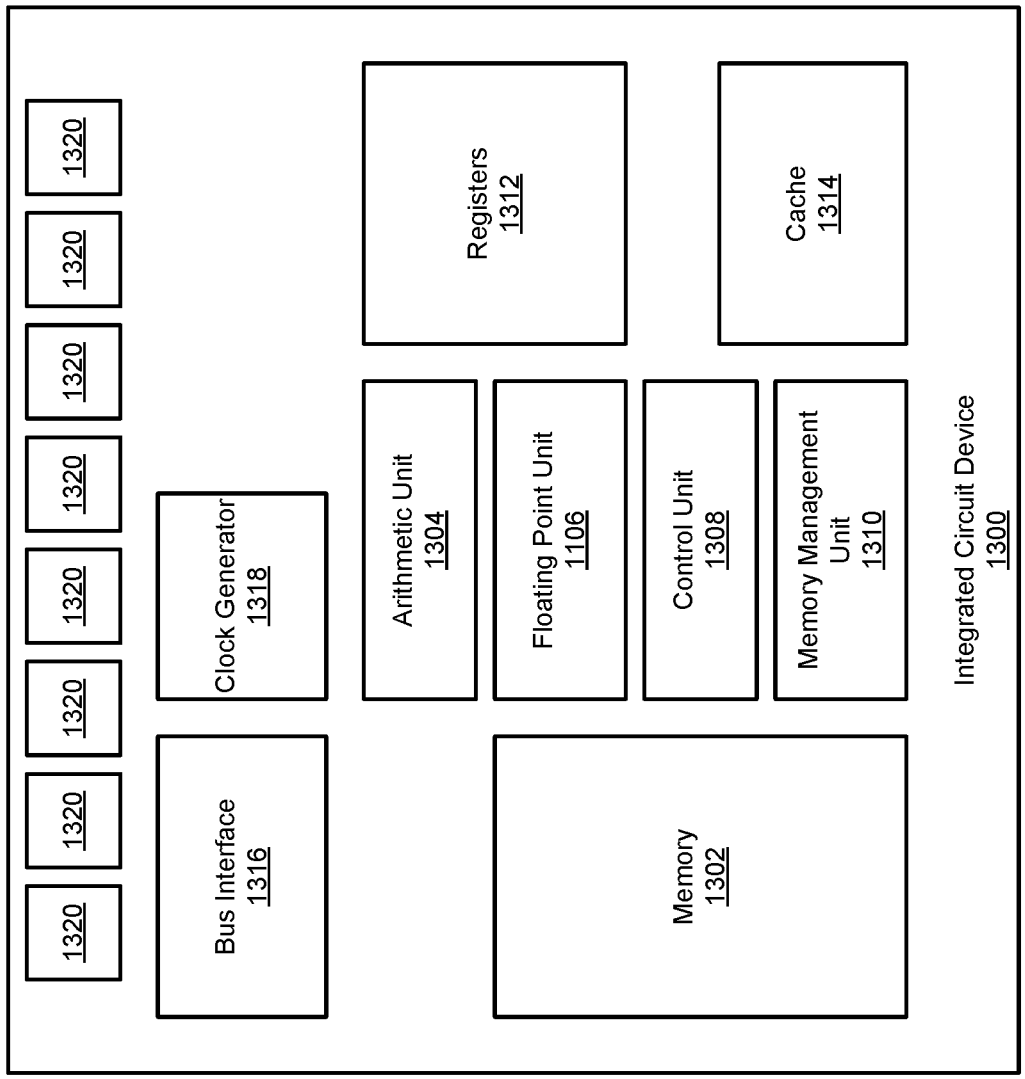
FIG. 13 includes a block diagram of an example integrated circuit device, as an example of a device on which the scan testing techniques discussed above can be applied.

FIG. 13 includes a block diagram of an example integrated circuit device 1300, as an example of a device on which the scan channel configuration techniques discussed above can be applied. In various examples, the integrated circuit device 1300 is a semiconductor-based device that includes multiple layers of substrates forming transistors, capacitors, vias, and other circuit elements. In the example of FIG. 13, the integrated circuit device 1300 is implemented on a single die. In other examples, the integrated circuit device 1300 can be implemented using multiple dies. In still other examples, the integrated circuit device 1300 can be a circuit cell, or a design core, in which the scan channel configuration techniques can be implemented. Such as circuit cell can be used in a tiled arrangement of abutted circuit cells as part of a larger integrated circuit device.

The example integrated circuit device 1300 includes a memory 1302, an arithmetic unit 1304, a floating point unit 1306, a control unit 1308, a memory management unit 1310, registers 1312, a cache 1314, a bus interface 1316, a clock generator 1318, and multiple I/O pads 1320.

The memory 1302 can include circuits that are able to store values. For example, the memory 1302 can store instructions that are to be executed by the integrated circuit device 1300. The memory 1302 can be implemented using, for example, a variety of Static Random Access Memory (SRAM). In some examples, the memory 1302 may be small, in view of the limited amount of space in the integrated circuit device 1300.

The arithmetic unit 1304 may be configurable to perform arithmetic or logical operations. The arithmetic unit 1304 can be configured, for example, to read operands from one or more of the registers 1312, and to place results in a register.

The floating point unit 1306 can perform floating point arithmetic. The floating point unit 1306 can also be configured to read operations from the registers 1312 and to write results to the registers 1312.

The control unit 1308 can include circuitry for executing instructions and/or for coordinating the activities of the other blocks in the integrated circuit device 1300. For example, the control unit 1308 can configure the registers from which arithmetic unit 1304 is to read operands, as well as the operation the arithmetic unit 1304 is to perform on the operands. The control unit 1308 can further instruct the arithmetic unit 1304 where to place a result of the operation. As a further example, the control unit 1308 can write data into the registers 1312, and read data from the registers 1312, possibly to move the data to the memory 1302 and/or elsewhere.

The memory management unit 1310 can manage the memory 1302, the cache 1314, and possibly also the registers 1312. The memory management unit 1310 can, for example, cause data to be moved from the memory 1302 to the cache 1314, or vice versa. As a further example, the memory management unit 1310 can cause data to be moved from the cache 1314 to an external memory, or vice versa. In various examples, the operations that the memory management unit 1310 performs are controlled by the control unit 1308. For example, when the control unit 1308 determines that the integrated circuit device 1300 is ready for new instructions to be loaded into the memory 1302, the control unit 1308 can instruct the memory management unit 1310 to obtain the instructions from an external memory.

The registers 1312 can provide temporary storage for values being operated on by the integrated circuit device 1300. Compared to the memory 1302, each register is quite small, storing, for example, one data word each (where a data word can be 16, 32, 64, or another number of bits long). Each register is also directly accessible, such that the number of registers may be limited by the wiring required for each to be independently readable and writeable. Because the registers 1312 are directly accessible and can be read or written faster than the memory 1302, it may be preferable for values being operated on by, for example, the arithmetic unit 1304 or the point unit 1306 to be in the registers 1312, rather than in the memory 1302.

The cache 1314 is a memory where data that was recently used by the integrated circuit device 1300, and/or that may soon need to be used, can be stored. The data may, for example, have been in the memory 1302, was operated on by the control unit 1308, and then was moved to the cache 1314 to make space in the memory 1302 for new data. As another example, the integrated circuit device 1300 may have needed a particular data word, which the memory management unit 1310 may have loaded into the cache 1314 along with a set of data words (e.g., a cache line), under the assumption that the integrated circuit device 1300 may need a data word that was stored in external memory next to the particular data word. The cache 1314 can thus save time by reducing how frequently the integrated circuit device 1300 needs to access external memory. Determining when data needs to be loaded into the cache from an external memory, and/or when data needs to be moved out of the cache, can be handled by the memory management unit 1310.

The bus interface 1316 can include circuitry that enables the integrated circuit device 1300 to communicate with other devices, such as external memories. The bus interface 1316 can implement various protocols, such as Advanced eXtensible Interface (AXI), Advanced High-performance Bus (AHB), Peripheral Component Interconnect (PCI), or another bus protocol. The bus interface 1316 can be connected to the I/O pads 1320 to enable the bus interface 1316 to communicate with external devices. In various examples, the integrated circuit device 1300 can include multiple bus interfaces, which may implement different protocols.

The clock generator 1318 can generate one or more clock signals for the integrated circuit device 1300, which may have different frequencies. In some examples, the clock generator 1318 operates off of a clock input to the integrated circuit device 1300 (received at one of the I/O pads 1320), which the clock generator 1318 can use to generate clock signals of different frequencies.

The I/O pads 1320 can include circuitry for connecting the integrated circuit device 1300 to the physical pins or balls of the package that encloses the integrated circuit device 1300. The pins or balls (e.g., drops of conductive material) can connect the integrated circuit device 1300 to a printed circuit board. Some of the I/O pads 1320 can be for inputting signals into the integrated circuit device 1300, others can be for outputting signals from the integrated circuit device 1300, and/or others can be bi-directional. In most cases, the I/O pads 1320 are present along most of the edges of the integrated circuit device 1300, but only a few are illustrated here, for the sake of clarity.

These blocks illustrated in FIG. 13 provide examples of blocks that can be found in an integrated circuit device, and are intended only to be illustrative. In other examples, an integrated circuit device can include components that are not illustrated here, can include multiple instances of a component, and/or can lack some of the components that are included in this illustration. The arrangement and spacing of the blocks are also not intended to be representative of the arrangement and spacing that may be found in an actual device. The arrangement and spacing have been selected only for the convenience of the illustration.

Figure 14:
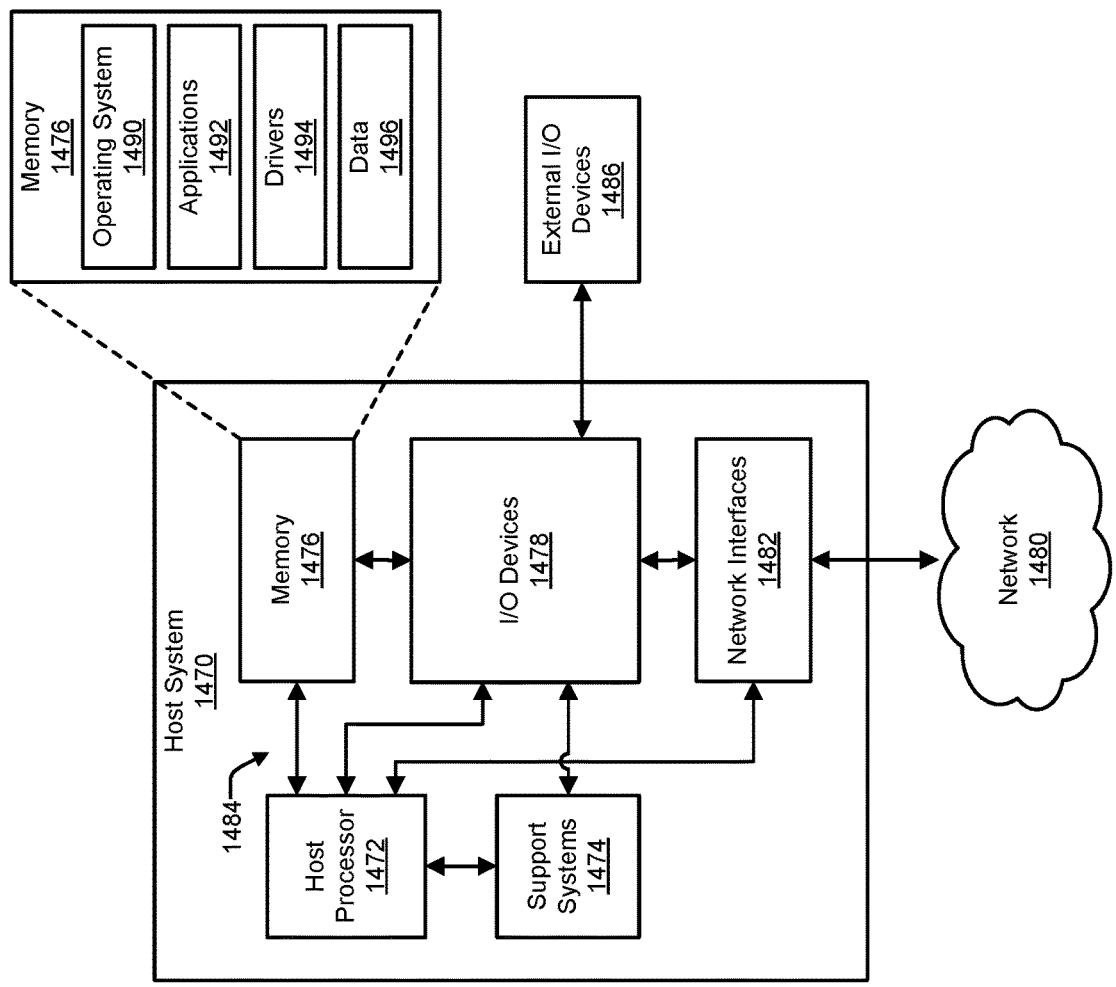
FIG. 14 includes a block diagram that illustrates an example of a host system in which the integrated circuit device of FIG. 13 can be used.

FIG. 14 includes a block diagram that illustrates an example of a host system 1470 in which the integrated circuit device of FIG. 11 can be used. In some examples, the host system 1470 of FIG. 14 can be used to implement a general purpose computer, such as a desktop computer, a laptop computer, a server computer, a thin client, and so on. In some examples, the host system 1470 can be used to implement mobile computing devices, such as a mobile phone, a smart phone, a personal digital assistant (PDA), or a tablet computer, among other examples. In some examples, the host system 1470 can be used to implement somewhat more special purpose devices, such as home assistants, gaming consoles, electronic books (e-books), media centers, and so on. In some examples, the host system 1470 can be used to implement computing devices incorporated into appliances, automobiles and other vehicles, robots, and other electronic devices. The system 1470 is also an example of a computer system that can implement embodiments of the method described in FIG. 12.

The example host system 1470 of FIG. 14 includes a host processor 1472, processor memory 1476, Input/Output (I/O) devices 1478, network interfaces 1482, and various support systems 1474. In various implementations, the host system 1470 can include other hardware that is not illustrated here.

The host processor 1472 is a general purpose integrated circuit that is capable of executing program instructions. In some examples, the host processor 1472 can include multiple processing cores. In a multi-core processor, each core may be able to independently execute program code. In some examples, the cores may share resources, such as buses and caches. In some examples, the host processor 1472, whether single core or multi-core, may be a multi-threaded processor, in which case the host processor 1472 can execute multiple threads of execution (e.g., independent sets of program code) at the same time. In some examples, the host system 1470 can include more than one host processor 1472.

The memory 1476 can include memory that is used by the host processor 1472 for storage of program code that the host processor 1472 is in the process of executing, as well as for storage of values that are being operated on by the host processor 1472. For example, the memory 1476 can be storing an operating system 1490, one or more applications 1492, one or more device drivers 1494, and data 1496 associated with the operating system 1490, the applications 1492, and/or the drivers 1494. In various examples, memory 1476 can be implemented using volatile memory types (such as Random Access Memory (RAM) type memories) and/or non-volatile memory types (such as Read-Only Memory (ROM), flash memory, etc.). In some examples, some or all of the memory 1476 may be accessible to the I/O devices 1478. The processor memory 1476 is often referred to as DRAM, though the actual implementation of the memory may not make use of Dynamic Random Access Memory.

The operating system 1490 can coordinate the activities of the hardware of the host system 1470, as well as the activities of the applications 1492 and drivers 1494. For example, the operating system 1490 can perform operations such as scheduling tasks, executing applications, or controlling peripheral devices. In some examples, the operation system 1490 can include a hypervisor which can support the operation of virtual machines on the host system 1470. In some examples, the hypervisor runs as kernel space application. In these and other examples, each virtual machine can execute an independent operating system, and may have different virtual hardware configurations. Examples of operating systems include Unix, Linux, Windows, Mac OS, iOS, Android, and the like. The operating system 1490 may also be a proprietary operating system.

The applications 1492 can enable a user to interact with the host system 1470 and/or with systems on the network 1480. The applications 1492 can include user space applications, such as web browsers, text editors, video or audio players, and so on. Each of the applications 1492 can be embodied as program code, or instructions that, when executed, cause the host processor 1472 to perform operations that implement the applications 1492. In various examples, the code for the applications 1492 can be stored on a non-volatile storage medium, such as a disk drive, and can be copied into the memory 1476 when being executed.

The drivers 1494 can include programs that manage communications between the operating system 1490 and/or applications 1492 and hardware components of the host system 1470, such as the I/O devices 1478 and network interfaces 1482. For example a driver can provide an Application Programming Interface (API) that provides abstract commands for using the functions of an I/O device. In this example, the API may be standardized, and the driver may be able to translate the abstract commands to specific commands for a particular I/O device. Drivers are often kernel space applications, so that user-space code may be prevented from accidentally or intentionally misusing the hardware of the host system 1470.

The data 1496 can include data used and/or operated on by the operating system 1490, applications 1492, and/or drivers 1494. Examples of such data include web pages, video data, audio data, images, user data, and so on. Alternatively or additionally, the data 1496 can include software libraries that may be used by the operating system 1490, applications 1492, and/or drivers 1494. In some examples, the data 1496 may be accessible to systems on the network 1480.

The I/O devices 1478 can include hardware that adds functionality to the example host system 1470. For example, the I/O devices 1478 can include non-volatile storage devices, such as solid state drives, magnetic drives, optical drives, and/or tape drives, among other examples. The I/O devices 1478 can further include accelerators such as graphics accelerators, and other, more special purpose, devices. As another example, the I/O devices 1478 can include hardware for connecting to external I/O devices 1486, such as keyboards, monitors, printers, and external storage drives among other devices. The network interfaces 1482 are also I/O devices, though are illustrated separately here for the sake of clarity. Herein, some I/O devices may also be referred to as peripheral devices. In various examples, an I/O device can include a processor and memory that are additional to the host processor 1472 and memory 1476 of the host system 1470. The processor of the I/O device may operate independently of the host processor 1472, or may be used by the host processor 1472 for various purposes. For example, the I/O device can include a Graphics Processing Unit (GPU), which the host processor 1472 can use for large computations. In some examples, the host system 1470 can also be connected to external I/O devices 1486, such as external hard drives.

In some examples, one or more of the I/O devices 1478 can be based on one of the Peripheral Component Interconnect (PCI) standards. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices in a host system. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the host system 1470 can include a storage device that implements NVMe as the primary communication interface.

A PCI-based device can include one or more functions. A "function" describes operations that may be provided by the device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, a PCI-based device can include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to the operating system 1490 and/or applications 1492 to be multiple devices providing the same functionality. The functions of an SR-IOV-capable device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host system 1470.

The network interfaces 1482 can enable the host system 1470 to communicate with a network 1480 or with multiple networks. The network interfaces 1482 can include, for example, one or more network interface cards (NICs). The network interfaces 1482 can include, for example, physical ports for connecting to a wired network. Alternatively or additionally, the network interfaces 1482 can include antennas for connecting to a wireless network. In some examples, the network interfaces 1482 can include more than one physical port, and/or more than one antenna, so that the host system 1470 can communicate with multiple networks at the same time.

The support systems 1474 can include various hardware that supports the operations of the host processor 1472 and/or the I/O devices 1478. For example, the support systems 1474 can include a boot ROM that stores the code for the Basic Input/Output System (BIOS) of the host system 1470, and that enables the host system 1470 to boot from being powered on. As another example, the various support systems 1474 can include a power supply and power subsystem. Other devices that may be found in the support systems 1474 can include a Board Management Controller (BMC) and/or various other volatile or non-volatile memories.

The host system 1470 can further include one or more busses 1484, which may also be referred to as interconnects. The busses 1484 can enable the various components of the example host system 1470 to communicate with one another. For example, the busses 1484 can include a bus that is dedicated to communications between the host processor 1472 and the processor memory 1476. As another example, the busses 1484 can include an I/O bus, which enables the host processor 1472 to communicate with the I/O devices 1478, and which may enable the I/O devices 1478 to communicate among each other. In some examples, the I/O bus is a PCI-based bus or bus network. The busses 1484 can include other busses, such as a power management bus, sideband busses, control busses, and/or dedicated busses between certain components (e.g., a BMC and the host processor 1472).

The memory 1476, storage devices, and other memories discussed above are each examples of computer-readable medium. Other examples of computer-readable medium include removable storage devices, such as magnetic tapes, floppy disks, Compact Discs (CDs), Digital Versatile Discs (DVDs), Blue-Ray disks, and flash memory drives, among other examples. In each of these examples the computereadable medium is capable of storing program code that can be executed by the host processor 1472. In some cases, the computer-readable medium may be non-transitory, meaning that the data stored on the computer-readable medium remains stored on the medium when power is not applied to the computer readable medium. In contrast, when power is removed from a transitory computer-readable medium, such as RAM, the data is deleted from the medium. Examples of a non-transitory computer-readable medium include ROM-based memory, hard disks, removable disks such as those listed above, and flash-based memory, among other examples.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 11 and FIG. 14, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit device, comprising:
    a first circuit tile, comprising a first instance of a circuit cell; and
    a second circuit tile, comprising a second instance of the circuit cell;
    wherein the circuit cell comprises first and second edges, the circuit cell including a scan channel circuit, the scan channel circuit including:
        a configurable scan channel switch; and
        first and second scan channels extending between the first edge and the second edge of the circuit cell through the configurable scan channel switch,
        wherein the configurable scan channel switch selectively couples the scan channels to a scan test circuit in the circuit cell for receiving scan-in test data for performing a scan test in the circuit cell, and for outputting scan-out test result data from the scan test circuit;
    wherein the first circuit tile and the second circuit tile are disposed in a tiled arrangement in a circuit block with the second edge of the first circuit tile abutted to the first edge of the second circuit tile, and wherein the first and second scan channels in the first circuit tile extend through corresponding scan channels in the second circuit tile; and
    wherein, in the first circuit tile or the second circuit tile, the scan channel circuit is configurable to receive scan-in test data from the first edge, and to select between outputting scan-out result data to the first edge, and outputting the scan-out result data to the second edge.

2. The integrated circuit device of claim 1, wherein the configurable scan channel switch in the circuit cell comprises:
    a first input node configured to receive scan-in data from the first scan channel;
    a second input node configured to receive scan-in data from the second scan channel;
    a first output node for providing scan-out data from the scan test circuit to the first scan channel;
    a second output node configured for providing scan-out data from the scan test circuit to the second scan channel;

a first multiplexer circuit configured to, in response to a first selection signal, couple an input to the scan test circuit to one of the first input node or the second input node;

a second multiplexer circuit configured to, in response to a second selection signal, couple the first output node to one of an output from the scan test circuit or the first input node; and a third multiplexer circuit configured to, in response to a third selection signal, couple the second output node to one of the output from the scan test circuit or the second input node.

3. The integrated circuit device of claim 1,
wherein the circuit cell further comprises third and fourth edges, and the scan channel circuit further comprises third and fourth scan channels extending between the third edge and the fourth edge of the circuit cell through the configurable scan channel switch, and wherein, in the first circuit tile or the second circuit tile, the scan channel circuit is configurable to receive scan-in test data from any of the first, second, third, and fourth edges, and output scan-out result data to any of the first, second, third, and fourth edges.

4. The integrated circuit device of claim 3, wherein the configurable scan channel switch in the circuit cell comprises:

a first input node configured to receive scan-in data from the first scan channel;

a second input node configured to receive scan-in data from the second scan channel;

a third input node configured to receive scan-in data from the third scan channel;

a fourth input node configured to receive scan-in data from the fourth scan channel;

first, second, third, and fourth multiplexer circuits, each coupled to the first second, third, and fourth input nodes, and each configured to receive selectable input from any of the four input nodes to provide output data to the first, second, third, or fourth scan channels, respectively, wherein the first, second, third, and fourth multiplexer circuits are further configured to receive the scan-out test result data from the scan test circuit as selectable input; and a fifth multiplexer circuit configured to select one of the first, second, third, or fourth input nodes for receiving the scan-in test data for providing to the scan test circuit.

5. An integrated circuit device, comprising:
circuit tiles disposed in a tiled arrangement in a circuit block between a first boundary and a second boundary, wherein each of the circuit tiles is an instance of a circuit cell having a first edge and a second edge, the circuit cell having a scan channel circuit that includes:
a configurable scan channel switch; and
scan channels extending between the first edge and the second edge of the circuit cell through the configurable scan channel switch;

wherein respective scan channels in the circuit tiles are joined together and extend between the first boundary and the second boundary, and wherein each of the circuit tiles is configurable to receive scan-in test data through a scan channel from the first boundary, perform a scan test, and to select between outputting scan-out result data of the circuit tile through a scan channel to the first boundary, and outputting the scan-out result data to the second boundary.

6. The integrated circuit device of claim 5, wherein the configurable scan channel switch in the circuit cell is configured, in response to configuration input data, to selectively couple the scan channels to a scan test circuit in the circuit cell for receiving scan-in test data for performing a scan test in the circuit cell, and for outputting scan-out test result data from the scan test circuit.

7. The integrated circuit device of claim 6, wherein the configurable scan channel switch in the circuit cell comprises:

a first input node configured to receive scan-in data from a first scan channel;

a second input node configured to receive scan-in data from a second scan channel;

a first output node for providing scan-out data from the scan test circuit to the first scan channel;

a second output node configured for providing scan-out data from the scan test circuit to the second scan channel;

a first selection circuit configured to, in response to a first selection signal, couple an input to the scan test circuit to one of the first input node or the second input node;

a second selection circuit configured to, in response to a second selection signal, couple the first output node to one of an output from the scan test circuit or the first input node; and a third selection circuit configured to, in response to a third selection signal, couple the second output node to one of the output from the scan test circuit or the second input node.

8. The integrated circuit device of claim 7, wherein each of the selection circuits is a multiplexer circuit.

9. The integrated circuit device of claim 6,
wherein the circuit block further comprises third and fourth boundaries;

wherein the circuit cell further comprises third and fourth edges, and the scan channel circuit further comprises scan channels extending between the third edge and the fourth edge of the circuit cell through the configurable scan channel switch;

wherein, in each of the circuit tiles, the scan channel circuit is configurable to receive scan-in test data from any of the first, second, third, and fourth edges, and to output scan-out result data to any of the first, second, third, and fourth edges; and wherein each of the circuit tiles is configurable to receive scan-in test data from any one of the first boundary, the second boundary, the third boundary, and the fourth boundary, perform a scan test, and output scan-out result data to any one of the first boundary, the second boundary, the third boundary, and the fourth boundary.

10. The integrated circuit device of claim 9, wherein the configurable scan channel switch in the circuit cell comprises:

a first input node configured to receive scan-in data from a first scan channel;

a second input node configured to receive scan-in data from a second scan channel;

a third input node configured to receive scan-in data from a third scan channel;

a fourth input node configured to receive scan-in data from a fourth scan channel;

first, second, third, and fourth multiplexer circuits, each coupled to the first, second, third, and fourth input nodes, and each configured to receive selectable input from any of the four input nodes to and provide output data to the first, second, third, or fourth scan channels, respectively, wherein the first, second, third, and fourth multiplexer circuits are further configured to receive the scan-out test result data from the scan test circuit as selectable input; and
a fifth multiplexer circuit configured to select one of the first, second, third, or fourth input nodes for receiving the scan-in test data for providing to the scan test circuit.

11. The integrated circuit device of claim 10, wherein the configurable scan channel switch further comprises a compensation pipeline coupled to the output of the fifth multiplexer circuit.

12. The integrated circuit device of claim 6, wherein the scan channel circuit in the circuit cell comprises one or two scan channels for each of the circuit tiles, and wherein the configurable scan channel switch comprises selection circuits to configure each of the circuit tiles to receive scan-in test data from either the first boundary or the second boundary, and output scan-out result data of the circuit tile to either the first boundary or the second boundary.

13. The integrated circuit device of claim 12, wherein the configurable scan channel switch in the circuit cell receives selection signals for the selection circuits from a processor in the integrated circuit device or from an external equipment.

14. The integrated circuit device of claim 5, wherein one or more of the circuit tiles comprises one or more scan channels that are configured as pass-through connections in the one or more circuit tiles.

15. A non-transitory computer-readable medium having stored thereon instructions that, when executed by one or more processors, cause the one or more processors to perform operations including:
    adding a circuit cell design to an integrated circuit device design;
    adding a configurable scan channel switch in the circuit cell design;
    adding configurable scan channels between a first edge and a second edge of the circuit cell design;
    placing multiple circuit tiles in the integrated circuit device design, wherein each circuit tile is an instance of the circuit cell;
    disposing the multiple circuit tiles in a tiled arrangement between a first boundary and a second boundary in the integrated circuit device design; and
    connecting the configurable scan channels in the multiple circuit tiles together such that the configurable scan channels extend between the first boundary and the second boundary in the integrated circuit device design;
    wherein the configurable scan channel switch is operable to configure one or more of the configurable scan channels to connect a scan test circuit in a circuit tile of the multiple circuit tiles to receive scan-in test data from either the first boundary or the second boundary, and to output scan-out result data of the circuit tile to either the first boundary or the second boundary, and
    wherein the multiple circuit tiles are each operable to receive scan-in test data from the first boundary, perform a scan test, and select between outputting scan-out result data to the first boundary and outputting the scan-out data to the second boundary.

16. The non-transitory computer-readable medium of claim 15, wherein connecting the configurable scan channels in the multiple circuit tiles together comprises placing the multiple circuit tiles in an abutted tiled arrangement causing the scan channels in neighboring tiles to be connected.

17. The non-transitory computer-readable medium of claim 15, wherein the configurable scan channel switch in the circuit cell is configured, in response to configuration input data, to selectively couple the scan channels to a scan test circuit in the circuit cell for receiving scan-in test data for performing a scan test in the circuit cell, and for outputting scan-out test result data from the scan test circuit.

18. The non-transitory computer-readable medium of claim 17, wherein the configurable scan channel switch in the circuit cell comprises:
    a first input node configured to receive scan-in data from a first scan channel;
    a second input node configured to receive scan-in data from a second scan channel;
    a first output node for providing scan-out data from the scan test circuit to the first scan channel;
    a second output node configured for providing scan-out data from the scan test circuit to the second scan channel;
    a first selection circuit configured to, in response to a first selection signal, couple an input to the scan test circuit to one of the first input node and the second input node;
    a second selection circuit configured to, in response to a second selection signal, couple the first output node to one of an output from the scan test circuit and the first input node; and
    a third selection circuit configured to, in response to a third selection signal, couple the second output node to one of the output from the scan test circuit and the second input node.

19. The non-transitory computer-readable medium of claim 18, wherein each of the selection circuits is a multiplexer circuit.

20. The non-transitory computer-readable medium of claim 17,
    wherein the tiled arrangement further comprises third and fourth boundaries;
    wherein the circuit cell further comprises third and fourth edges, and scan channels extending between the third edge and the fourth edge of the circuit cell through the configurable scan channel switch;
    wherein, in each of the circuit tiles, the scan channel circuit is configurable to receive scan-in test data from any of the first, second, third, and fourth edges, and to output scan-out result data to any of the first, second, third, and fourth edges; and
    wherein each of the circuit tiles is configurable to receive scan-in test data from any one of the first boundary, the second boundary, the third boundary, and the fourth boundary, perform a scan test, and output scan-out result data to any one of the first boundary, the second boundary, the third boundary, and the fourth boundary.

* * * * *